US012618902B2

(12) United States Patent
Lee et al.

(10) Patent No.: US 12,618,902 B2
(45) Date of Patent: May 5, 2026

(54) PROBE CARD INCLUDING POWER COMPENSATION CIRCUIT AND TEST SYSTEM INCLUDING THE SAME

(71) Applicant: Samsung Electronics Co., Ltd., Suwon-si (KR)

(72) Inventors: Seongkwan Lee, Suwon-si (KR); Minho Kang, Suwon-si (KR); Jongpill Park, Suwon-si (KR); Cheolmin Park, Suwon-si (KR); Jaemoo Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 176 days.

(21) Appl. No.: 18/671,017

(22) Filed: May 22, 2024

(65) Prior Publication Data

US 2025/0138088 A1     May 1, 2025

(30) Foreign Application Priority Data

Nov. 1, 2023    (KR) ........................ 10-2023-0148981

(51) Int. Cl.
  G01R 31/40      (2020.01)
  G01R 1/073      (2006.01)
  G01R 31/317     (2006.01)

(52) U.S. Cl.
  CPC ...  G01R 31/31721 (2013.01); G01R 1/07342 (2013.01)

(58) Field of Classification Search
  CPC ............ G01R 31/2834; G01R 31/2886; G01R 31/2879; G01R 31/2889; G01R 31/31721; G01R 1/07314; G01R 1/07342; G01R 1/07378; G01R 1/06711; G01R 1/06722; G01R 1/06738; G01R 1/06761; G01R 1/06772
  See application file for complete search history.

(56) References Cited

U.S. PATENT DOCUMENTS 7,187,194 B2     3/2007  Robertazzi
7,245,134 B2 *   7/2007  Granicher ........ G01R 31/31926
                                             324/762.05

(Continued)

FOREIGN PATENT DOCUMENTS

CN        110780178 A      2/2020
KR        102006023 B1    10/2019
          (Continued)

*Primary Examiner* — Thang X Le
(74) *Attorney, Agent, or Firm* — Wolf, Greenfield & Sacks, P.C.

(57)          ABSTRACT

A probe card includes a plurality of power lines that are electrically connected to the plurality of DUTs, a plurality of ground lines that are electrically connected to the plurality of DUTs and to each other, and a plurality of power compensation circuits that are electrically connected to respective ones of the plurality of power lines and respective ones of the plurality of ground lines, where the plurality of power compensation circuits are configured to generate and provide a plurality of compensated power supply voltages to the respective ones of the plurality of power lines, and where the plurality of compensated power supply voltages are configured to inhibit a variation of a ground voltage of the respective ones of the plurality of ground lines.

20 Claims, 21 Drawing Sheets

(56)                    References Cited

U.S. PATENT DOCUMENTS

| | | | | | |
|---|---|---|---|---|---|
| 7,307,434 | B2 * | 12/2007 | Watanabe | ................ | G05F 1/56 |
| | | | | | 323/273 |
| 9,759,769 | B2 | 9/2017 | Yoo et al. | | |
| 10,551,434 | B2 | 2/2020 | Yoo et al. | | |
| 11,585,833 | B2 | 2/2023 | Park | | |
| 2006/0132158 | A1 * | 6/2006 | Miller | ................ | G01R 31/2889 |
| | | | | | 324/754.07 |
| 2012/0169367 | A1 * | 7/2012 | Kuo | ................... | G01R 31/2889 |
| | | | | | 324/756.03 |
| 2016/0109482 | A1 * | 4/2016 | Richmond, II | .... | G01R 1/06766 |
| | | | | | 324/754.07 |

FOREIGN PATENT DOCUMENTS

| | | |
|---|---|---|
| KR | 102324800 B1 | 11/2021 |
| KR | 20220146304 A | 11/2022 |

* cited by examiner 100-1

10a

F I G. 4C
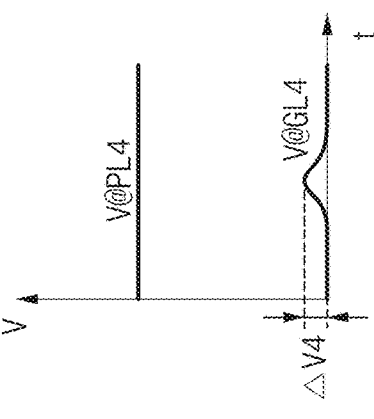
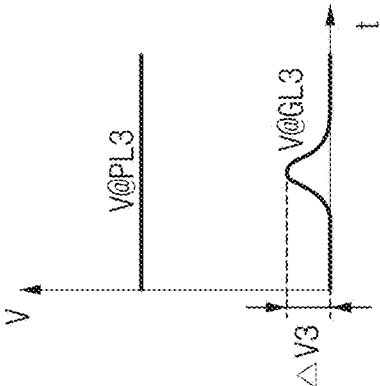
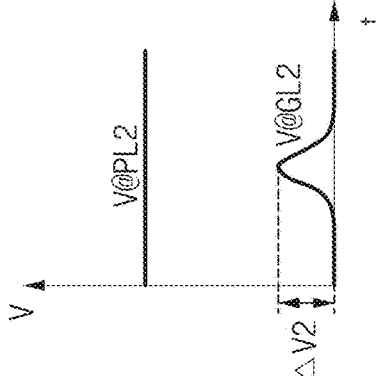
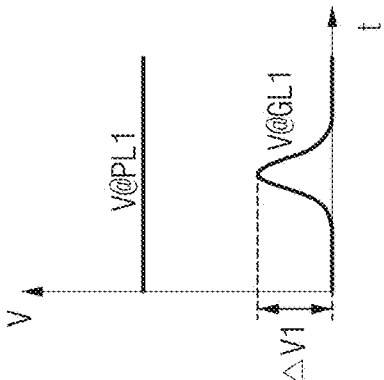

100-2

12a

500

<u>1000</u>

PROBE CARD INCLUDING POWER COMPENSATION CIRCUIT AND TEST SYSTEM INCLUDING THE SAME

CROSS-REFERENCE TO RELATED APPLICATION

This application claims priority under 35 USC § 119 to Korean Patent Application No. 10-2023-0148981 filed on Nov. 1, 2023 in the Korean Intellectual Property Office (KIPO), the contents of which are herein incorporated by reference in their entirety.

TECHNICAL FIELD

Example embodiments relate generally to semiconductor integrated circuits, and more particularly to probe cards including power compensation circuits and test systems including the probe cards.

BACKGROUND

Presently, semiconductor integrated circuits may be tested by an automatic test equipment (ATE) for mass production of the semiconductor integrated circuits. In addition, probe cards and pogo pin blocks may be used to electrically connect semiconductor integrated circuits under test with an ATE. To increase production of the semiconductor integrated circuits during mass production, multiple semiconductor integrated circuits may be simultaneously tested, and there may be a problem of yield degradation where normal semiconductor integrated circuits are determined to be defective semiconductor integrated circuits due to power interference between semiconductor integrated circuits.

SUMMARY

At least one example embodiment of the present disclosure provides a probe card including a power compensation circuit capable of efficiently reducing noise between devices under test (DUTs) caused by power.

At least one example embodiment of the present disclosure provides a test system including the probe card.

According to example embodiments, a probe card for testing a plurality of devices under test (DUTs) includes a plurality of power lines that are electrically connected to the plurality of DUTs, a plurality of ground lines that are electrically connected to the plurality of DUTs and to each other, and a plurality of power compensation circuits that are electrically connected to respective ones of the plurality of power lines and respective ones of the plurality of ground lines, where the plurality of power compensation circuits are configured to generate and provide a plurality of compensated power supply voltages to the respective ones of the plurality of power lines, and where the plurality of compensated power supply voltages are configured to inhibit a variation of a ground voltage of the respective ones of the plurality of ground lines.

According to example embodiments, a test system includes a probe card that is configured to electrically connect to a plurality of devices under test (DUTs), and an automatic test equipment (ATE) that is electrically connected to the plurality of DUTs through the probe card, where the ATE is configured to test the plurality of DUTs, where the probe card includes: a plurality of power lines that are electrically connected to the plurality of DUTs, a plurality of ground lines that are electrically connected to the plurality of DUTs and to each other, and a plurality of power compensation circuits that are electrically connected to respective ones of the plurality of power lines and respective ones of the plurality of ground lines, where the plurality of power compensation circuits are configured to generate and provide a plurality of compensated power supply voltages to the respective ones of the plurality of power lines, and where the plurality of compensated power supply voltages are configured to inhibit a variation of a ground voltage of respective ones of the plurality of ground lines.

According to example embodiments, a probe card for testing a plurality of devices under test (DUTs) includes a plurality of probes, a plurality of power lines that are electrically connected to respective ones of the plurality of DUTs by respective ones of the plurality of probes, a plurality of ground lines that are electrically connected to each other and the respective ones of the plurality of DUTs by the respective ones of the plurality of probes, and a plurality of power compensation circuits that are electrically connected to respective ones of the plurality of power lines and respective ones of the plurality of ground lines, where the plurality of power compensation circuits configured to generate and provide a plurality of compensated power supply voltages to the respective ones of the plurality of power lines, where the plurality of compensated power supply voltages are configured to inhibit a variation of a ground voltage of the respective ones of the plurality of ground lines, and where each of the plurality of power compensation circuits includes: a subtractor that is electrically connected to a respective one of the plurality of power lines and a respective one of the plurality of ground lines, where the subtractor is configured to obtain a sensing signal that is based on a voltage difference between a voltage of the respective one of the plurality of power lines and a voltage of the respective one of the plurality of ground lines, a linear regulator that is configured to generate a respective one of the plurality of compensated power supply voltages based on the sensing signal such that the voltage difference is fixed, where the linear regulator is configured to provide the respective one of the plurality of compensated power supply voltages to the respective one of the plurality of power lines, and a level setting circuit that is configured to determine an output voltage of the linear regulator.

The probe card and the test system according to example embodiments may include the plurality of power compensation circuits that generate the plurality of compensated power supply voltages for cancelling out or inhibit the variation in the ground voltage of the plurality of ground lines when the variation in the ground voltage occurs. Each of the plurality of power compensation circuits may measure and determine whether the voltage variation occurs on a respective one of the plurality of ground lines in real-time, and may compensate in real-time when the voltage variation occurs. Accordingly, the power supplied to the plurality of DUTs may be maintained at a constant level, and the yield degradation may be prevented or inhibited even when the plurality of DUTs are tested simultaneously.

BRIEF DESCRIPTION OF THE DRAWINGS

Illustrative, non-limiting example embodiments will be more clearly understood from the following detailed description taken in conjunction with the accompanying drawings.

FIGS. 4A, 4B, 4C, 4D and 5 are diagrams describing an operation of a probe card of FIG. 3.

DETAILED DESCRIPTION OF THE EMBODIMENTS

Figure 1:
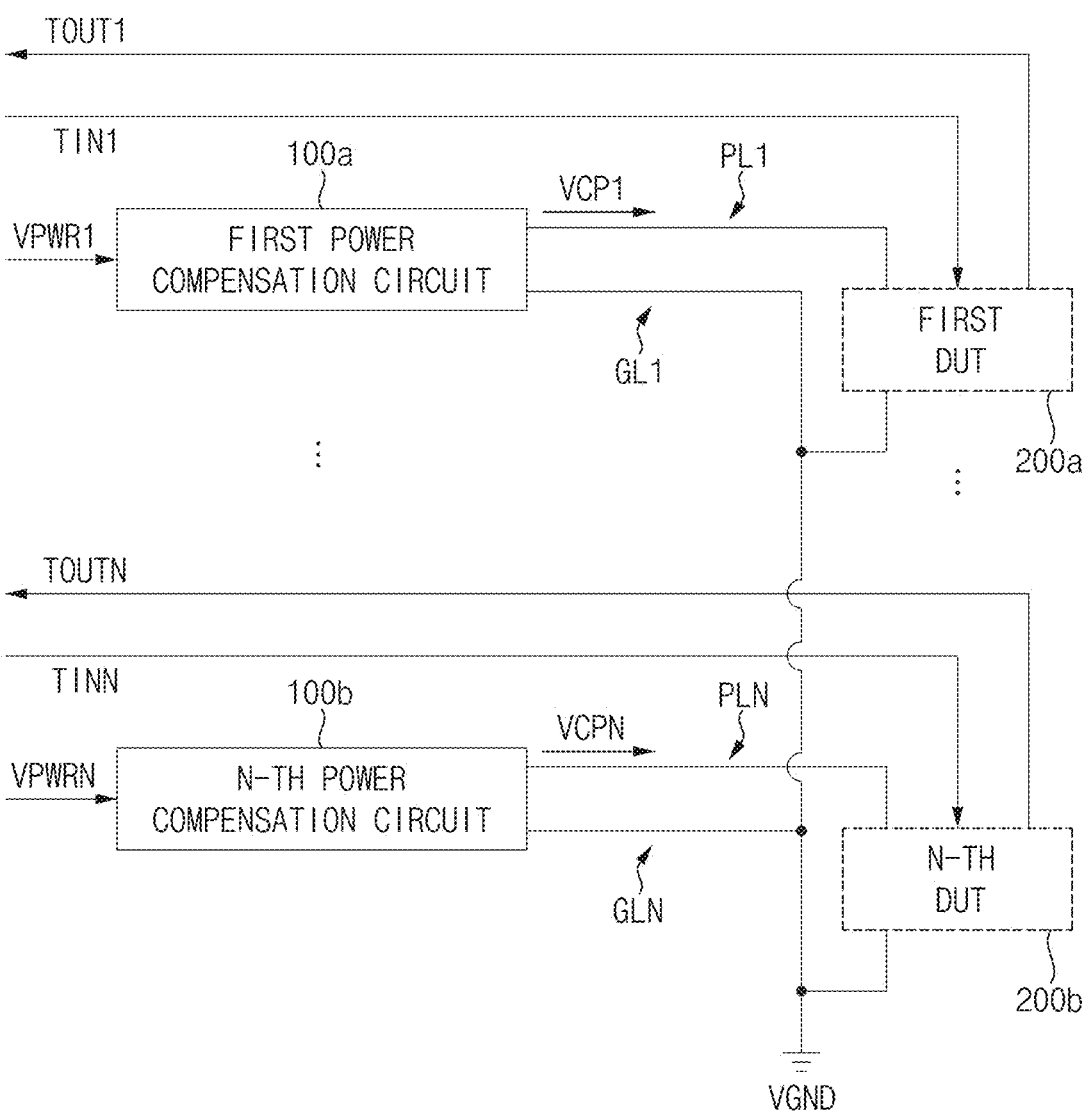
FIG. 1 is a block diagram illustrating a probe card according to example embodiments.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses.

It will be understood that when an element is referred to as being "on" another element, it can be directly on the other element or intervening elements may also be present. In contrast, when an element is referred to as being "directly on" another element, there are no intervening elements present. In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection.

In this application, the term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality, such as, but not limited to, transceivers, routers, input/output interface hardware, among others; or a combination of some or all of the above, such as in a system-on-chip. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), and volatile memory circuits (such as a static random access memory circuit or a dynamic random access memory circuit).

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a probe card according to example embodiments.

Referring to FIG. 1, a probe card 10 includes a plurality of power lines PL1, . . . , PLN, a plurality of ground lines GL1, . . . , GLN, and a plurality of power compensation (or correction or adjustment) circuits 100a, . . . , 100b.

The probe card 10 may be included in a test system for testing a plurality of devices under test (DUTs) (or devices to be inspected or inspection target devices) 200a, . . . , 200b. The plurality of DUTs 200a, . . . , 200b are devices that are targets inspected by the test system and may be verified before releasing.

For example, the plurality of DUTs 200a, . . . , 200b may be electrically connected to the test system through or via the probe card 10. The plurality of DUTs 200a, . . . , 200b may be supplied with power through the probe card 10, may receive a plurality of test input signals TIN1, . . . , TINN through the probe card 10, and may output a plurality of test output signals TOUT1, . . . , TOUTN through the probe card 10. The test input signals TIN1, . . . , TINN may be referred to as test signals or control signals. The test output signals TOUT1, . . . , TOUTN may be referred to as test result signals.

For example, the plurality of DUTs 200a, . . . , 200b may be or may include a plurality of image sensors, and the test system may be a system for testing the image sensors. For example, when the plurality of DUTs 200a, . . . , 200b are the plurality of image sensors, the plurality of test input signals TIN1, . . . , TINN may be signals for controlling operations of the plurality of image sensors, and the plurality of test output signals TOUT1, . . . , TOUTN may be image signals captured by the plurality of image sensors.

Configurations of the test system and the plurality of DUTs 200a, . . . , 200b will be described with reference to FIGS. 12 through 15.

The plurality of power lines PL1, . . . , PLN are connected to the plurality of DUTs 200a, . . . , 200b. For example, the plurality of power lines PL1, . . . , PLN may include the first power line PL1 to the N-th (where N is a positive integer greater than or equal to two) power line PLN, and the plurality of DUTs 200a, . . . , 200b may include the first DUT 200a to the N-th DUT 200b. For example, the first power line PL1 may be connected to the first DUT 200a, and the N-th power line PLN may be connected to the N-th DUT 200b. The plurality of power lines PL1, . . . , PLN may be formed individually and/or independently from each other. The plurality of DUTs 200a, . . . , 200b may receive power through the plurality of power lines PL1, . . . , PLN.

The plurality of ground lines GL1, . . . , GLN are connected to the plurality of DUTs 200a, . . . , 200b. For example, the plurality of ground lines GL1, . . . , GLN may include the first ground line GL1 to the N-th ground line GLN. For example, the first ground line GL1 may be connected to the first DUT 200a, and the N-th ground line GLN may be connected to the N-th DUT 200b. Unlike the plurality of power lines PL1, . . . , PLN, the plurality of ground lines GL1, . . . , GLN are connected to each other. For example, all of the plurality of ground lines GL1, . . . , GLN may be commonly connected to a ground node or a ground voltage VGND. The plurality of DUTs 200a, . . . , 200b may be commonly connected to the ground node or the ground voltage VGND through the plurality of ground lines GL1, . . . , GLN.

The plurality of power compensation circuits 100a, . . . , 100b are connected to the plurality of power lines PL1, . . . , PLN and the plurality of ground lines GL1, . . . , GLN. For example, the plurality of power compensation circuits 100a, . . . , 100b may include the first power compensation circuit 100a to the N-th power compensation circuit 100b. For example, the first power compensation circuit 100a may be connected to the first power line PL1 and the first ground line GL1, and the N-th power compensation circuit 100b may be connected to the N-th power line PLN and the N-th ground line GLN. For example, the number of the power compensation circuits 100a, . . . , 100b may be equal to the number of the power lines PL1, . . . , PLN and the number of the ground lines GL1, . . . , GLN.

The plurality of power compensation circuits 100a, . . . , 100b are connected the plurality of DUTs 200a, . . . , 200b through the plurality of power lines PL1, . . . , PLN and the plurality of ground lines GL1, . . . , GLN. For example, the first power compensation circuit 100a may be connected to the first DUT 200a through the first power line PL1 and the first ground line GL1, and the N-th power compensation circuit 100b may be connected to the N-th DUT 200b through the N-th power line PLN and the N-th ground line GLN.

The plurality of power compensation circuits 100a, . . . , 100b may generate a plurality of compensated power supply voltages VCP1, . . . , VCPN based on a plurality of power supply voltages VPWR1, . . . , VPWRN, and may provide the plurality of compensated power supply voltages VCP1, . . . , VCPN to the plurality of power lines PL1, . . . , PLN and the plurality of DUTs 200a, . . . , 200b. For example, the plurality of power supply voltages VPWR1, . . . , VPWRN may include the first power supply voltage VPWR1 to the N-th power supply voltage VPWRN, and the plurality of compensated power supply voltages VCP1, . . . , VCPN may include the first compensated power supply voltage VCP1 to the N-th compensated power supply voltage VCPN. For example, the first power compensation circuit 100a may generate the first compensated power supply voltage VCP1 based on the first power supply voltage VPWR1 and may provide the first compensated power supply voltage VCP1 as an operating power to the first power line PL1 and the first DUT 200a, and the N-th power compensation circuit 100b may generate the N-th compensated power supply voltage VCPN based on the N-th power supply voltage VPWRN and may provide the N-th compensated power supply voltage VCPN as an operating power to the N-th power line PLN and the N-th power supply voltage VPWRN. The power supply voltages VPWR1, . . . , VPWRN may be referred to as input power supply voltages. The compensated power supply voltages VCP1, . . . , VCPN may be referred to as output power supply voltages.

Each of the plurality of power supply voltages VPWR1, . . . , VPWRN may have a fixed voltage level. At an initial operation time, the plurality of power compensation circuits 100a, . . . , 100b may generate the plurality of compensated power supply voltages VCP1, . . . , VCPN each of which has a fixed voltage level, and the plurality of compensated power supply voltages VCP1, . . . , VCPN may have voltage levels lower than or equal to those of the plurality of power supply voltages VPWR1, . . . , VPWRN.

While the test system including the probe card 10 is operating, e.g., when a variation (or fluctuation or change) in the ground voltage VGND of the plurality of ground lines GL1, . . . , GLN occurs during the test operation, the plurality of power compensation circuits 100a, . . . , 100b may generate the plurality of compensated power supply voltages VCP1, . . . , VCPN each of which has a variable voltage level for inhibiting, cancelling out, or offsetting a variation in the ground voltage VGND, and may provide the plurality of compensated power supply voltages VCP1, . . . , VCPN to the plurality of power lines PL1, . . . , PLN.

For example, when the test operation is performed on a specific DUT among the plurality of DUTs 200a, . . . , 200b, a voltage of a ground line connected to the specific DUT may vary or change instantaneously or momentarily. Since the plurality of ground lines GL1, . . . , GLN are connected to each other as described above, voltages of all ground lines GL1, . . . , GLN may vary or change together. Due to such voltage variation, power interference between the DUTs 200a, . . . , 200b may occur, and there may be problems in which the DUTs 200a, . . . , 200b operate abnormally and/or normal DUTs are determined to be defective DUTs. The probe card 10 according to example embodiments may efficiently inhibit/cancel out and compensate for the voltage variation on the ground lines GL1, . . . , GLN (e.g., the power interference between the DUTs 200a, . . . , 200b) using the plurality of power compensation circuits 100a, . . . , 100b.

In some example embodiments, as will be described with reference to FIG. 8, the probe card 10 may further include a plurality of feedback lines connected to the plurality of power lines PL1, . . . , PLN. In some example embodiments, as will be described with reference to FIGS. 6A, 6B, 10A and 10B, the plurality of power supply voltages VPWR1, . . . , VPWRN, rather than the plurality of compensated power supply voltages VCP1, . . . , VCPN, may be provided as power to the plurality of DUTs 200a, . . . , 200b in a specific operation mode. In some example embodiments, as will be described with reference to FIGS. 13A and 13B, the probe card 10 may further include a plurality of probes for electrical contact with the plurality of DUTs 200a, . . . , 200b.

A conventional probe card may have a function of transmitting power supply voltages provided from an external device to DUTs, and ground lines in the conventional probe card are connected to each other. When voltage variations occur on the ground lines by operations of the DUTs, there may be a problem that power interference between the DUTs occurs.

The probe card 10 according to example embodiments may include the plurality of power compensation circuits 100a, . . . , 100b that generate the plurality of compensated power supply voltages VCP1, . . . , VCPN for cancelling out or inhibiting the variation in the ground voltage VGND of the plurality of ground lines GL1, . . . , GLN when the variation in the ground voltage VGND occurs. Each of the plurality of power compensation circuits 100a, . . . , 100b may measure and determine whether the voltage variation occurs on a respective one of the plurality of ground lines GL1, . . . , GLN in real-time, and may compensate in real-time when the voltage variation occurs. Accordingly, the power supplied to the plurality of DUTs 200a, . . . , 200b may be maintained at a constant level, and the yield degradation may be prevented or inhibited even when the plurality of DUTs 200a, . . . , 200b are tested simultaneously.

Figure 2:
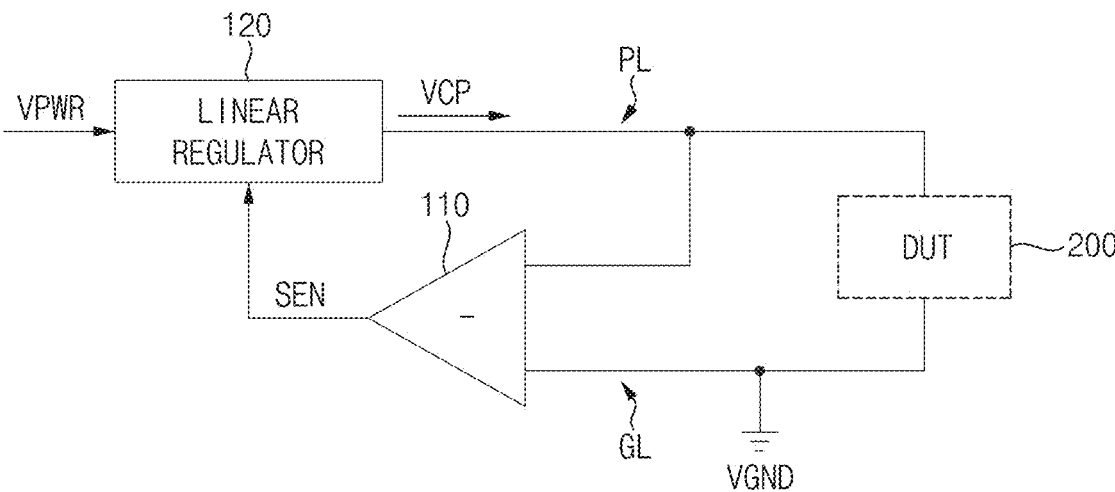
FIG. 2 is a block diagram illustrating an example of a power compensation circuit included in a probe card according to example embodiments.

FIG. 2 is a block diagram illustrating an example of a power compensation circuit included in a probe card according to example embodiments.

Referring to FIG. 2, a power compensation circuit 100-1 may be connected to a DUT 200, and may include a subtractor 110 and a linear regulator 120.

The subtractor 110 may be connected to a power line PL and a ground line GL, may detect a voltage of the power line PL and a voltage of the ground line GL, and may generate a sensing signal SEN representing a voltage difference between the voltage of the power line PL and the voltage of the ground line GL.

In some example embodiments, the subtractor 110 may be disposed or arranged within the probe card so as to be closest to the DUT 200. The subtractor 110 may accurately and efficiently detect the voltage of the power line PL and the voltage of the ground line GL (e.g., the power supply voltage and the ground voltage of the DUT 200) at a location closest to the DUT 200.

The linear regulator 120 may generate a compensated power supply voltage VCP based on a power supply voltage VPWR and the sensing signal SEN such that the voltage difference between the voltage of the power line PL and the voltage of the ground line GL is fixed or constant, and may provide the compensated power supply voltage VCP to the power line PL. The compensated power supply voltage VCP may be supplied as power to the DUT 200. When the variation in the voltage of the ground line GL, e.g., the variation in the ground voltage VGND, occurs, the linear regulator 120 may recognize such situation, may generate the voltage for cancelling out or inhibiting the voltage variation, and may supply the voltage for cancelling out or inhibiting the voltage variation to the DUT 200.

In some example embodiments, the linear regulator 120 may include a low dropout (LDO) regulator, a shunt regulator, a series regulator, and/or the like.

In some example embodiments, the power compensation circuit 100-1 may be one of the plurality of power compensation circuits 100a, . . . , 100b in FIG. 1. For example, when the power compensation circuit 100-1 is the first power compensation circuit 100a in FIG. 1, the subtractor 110 and the linear regulator 120 may be a first subtractor and a first linear regulator included in the first power compensation circuit 100a, respectively. Furthermore, the DUT 200, the power line PL, the ground line GL, the power supply voltage VPWR and the compensated power supply voltage VCP may be the first DUT 200a, the first power line PL1, the first ground line GL1, the first power supply voltage VPWR1 and the first compensated power supply voltage VCP1 in FIG. 1, respectively, and the sensing signal SEN may be a first sensing signal generated from the first subtractor.

Figure 3:
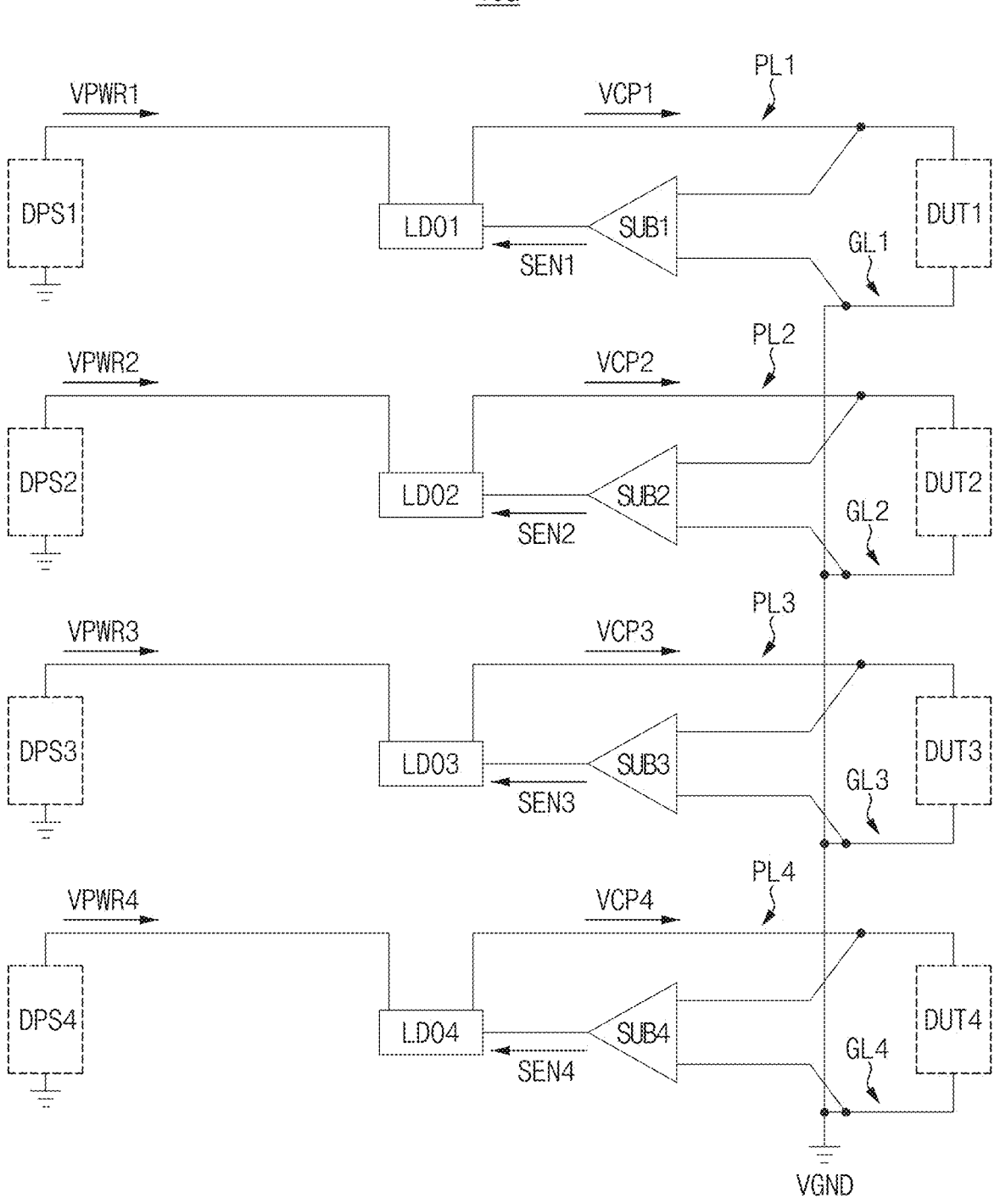
FIG. 3 is a block diagram illustrating an example of a probe card of FIG. 1.

FIG. 3 is a block diagram illustrating an example of a probe card of FIG. 1.

Referring to FIG. 3, a probe card 10a may include first, second, third and fourth power lines PL1, PL2, PL3 and PL4, first, second, third and fourth ground lines GL1, GL2, GL3 and GL4, and first, second, third and fourth power compensation circuits. For convenience of illustration, only components associated with or related to the power supply are illustrated in FIG. 3.

In some example embodiments, each of the first, second, third and fourth power compensation circuits may be the power compensation circuit 100-1 of FIG. 2. For example, the first power compensation circuit may include a first subtractor SUB1 and a first linear regulator LDO1, the second power compensation circuit may include a second subtractor SUB2 and a second linear regulator LDO2, the third power compensation circuit may include a third subtractor SUB3 and a third linear regulator LDO3, and the fourth power compensation circuit may include a fourth subtractor SUB4 and a fourth linear regulator LDO4. For example, the first, second, third and fourth linear regulators LDO1, LDO2, LDO3 and LDO4 may be LDO regulators.

FIG. 3 illustrates an example where the probe card 10a includes four channels (or power channels) and the number of channels and the number of DUTs are equal to each other. For example, one channel of the probe card 10a may include one power line, one ground line and one power compensation circuit.

For example, a first channel of the probe card 10a may include the first power line PL1 and the first ground line GL1, and may include the first subtractor SUB1 and the first linear regulator LDO1 that are included in the first power compensation circuit. The first channel may receive a first power supply voltage VPWR1 from a first power supply circuit DPS1, and may be connected to a first DUT1 through the first power line PL1 and the first ground line GL1. The first subtractor SUB1 may obtain a first sensing signal SEN1 representing a first voltage difference between a voltage of the first power line PL1 and a voltage of the first ground line GL1. The first linear regulator LDO1 may generate a first compensated power supply voltage VCP1 based on the first power supply voltage VPWR1 and the first sensing signal SEN1 such that the first voltage difference is fixed, and may provide the first compensated power supply voltage VCP1 to the first power line PL1. The first subtractor SUB1 and the first linear regulator LDO1 may detect and compensate for the voltage variation of the first ground line GL1 in real-time. The first power supply circuit DPS1 may serve to supply a sufficient voltage (e.g., the first power supply voltage VPWR1 having a voltage level higher than or equal to that of the first compensated power supply voltage VCP1 generated by the first linear regulator LDO1) to drive the first linear regulator LDO1.

Similarly, a second channel of the probe card 10a may include the second power line PL2 and the second ground line GL2, and may include the second subtractor SUB2 and the second linear regulator LDO2. The second channel may receive a second power supply voltage VPWR2 from a second power supply circuit DPS2, and may be connected to a second DUT2 through the second power line PL2 and the second ground line GL2. The second subtractor SUB2 may obtain a second sensing signal SEN2 representing a second voltage difference between a voltage of the second power line PL2 and a voltage of the second ground line GL2. The second linear regulator LDO2 may generate a second compensated power supply voltage VCP2 based on the second power supply voltage VPWR2 and the second sensing signal SEN2 such that the second voltage difference is fixed, and may provide the second compensated power supply voltage VCP2 to the second power line PL2. The second subtractor SUB2 and the second linear regulator LDO2 may detect and compensate for the voltage variation of the second ground line GL2 in real-time. The second power supply circuit DPS2 may serve to supply a sufficient voltage (e.g., the second power supply voltage VPWR2) to drive the second linear regulator LDO2.

In addition, a third channel of the probe card 10a may include the third power line PL3, the third ground line GL3, the third subtractor SUB3 and the third linear regulator LDO3. The third channel may receive a third power supply voltage VPWR3 from a third power supply circuit DPS3, and may be connected to a third DUT3 through the third power line PL3 and the third ground line GL3. The third subtractor SUB3 may obtain a third sensing signal SEN3 representing a third voltage difference between a voltage of the third power line PL3 and a voltage of the third ground line GL3. The third linear regulator LDO3 may generate a third compensated power supply voltage VCP3 based on the third power supply voltage VPWR3 and the third sensing signal SEN3 such that the third voltage difference is fixed, and may provide the third compensated power supply voltage VCP3 to the third power line PL3. The third subtractor SUB3 and the third linear regulator LDO3 may detect and compensate for the voltage variation of the third ground line GL3 in real-time. The third power supply circuit DPS3 may serve to supply a sufficient voltage (e.g., the third power supply voltage VPWR3) to drive the third linear regulator LDO3.

A fourth channel of the probe card 10a may include the fourth power line PL4, the fourth ground line GL4, the fourth subtractor SUB4 and the fourth linear regulator LDO4. The fourth channel may receive a fourth power supply voltage VPWR4 from a fourth power supply circuit DPS4, and may be connected to a fourth DUT4 through the fourth power line PL4 and the fourth ground line GL4. The fourth subtractor SUB4 may obtain a fourth sensing signal SEN4 representing a fourth voltage difference between a voltage of the fourth power line PL4 and a voltage of the fourth ground line GL4. The fourth linear regulator LDO4 may generate a fourth compensated power supply voltage VCP4 based on the fourth power supply voltage VPWR4 and the fourth sensing signal SEN4 such that the fourth voltage difference is fixed, and may provide the fourth compensated power supply voltage VCP4 to the fourth power line PL4. The fourth subtractor SUB4 and the fourth linear regulator LDO4 may detect and compensate for the voltage variation of the fourth ground line GL4 in real-time. The fourth power supply circuit DPS4 may serve to supply a sufficient voltage (e.g., the fourth power supply voltage VPWR4) to drive the fourth linear regulator LDO4.

However, example embodiments are not limited thereto, and the number of channels included in the probe card and the number of DUTs connected to the probe card may be variously determined according to example embodiments.

FIGS. 4A, 4B, 4C, 4D and 5 are diagrams for describing an operation of a probe card of FIG. 3.

Figure 4A:
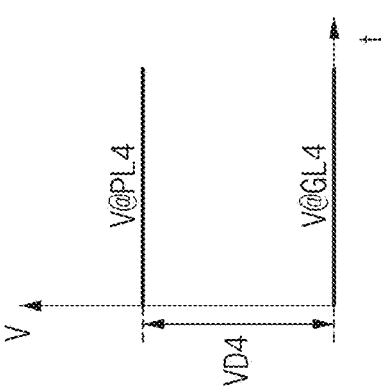
Figure 4A:
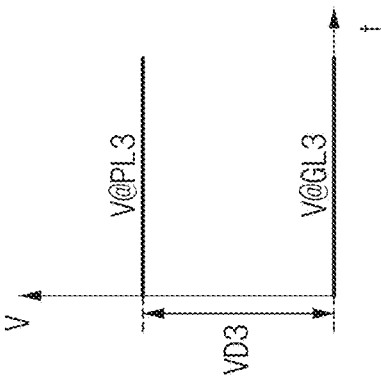
Figure 4A:
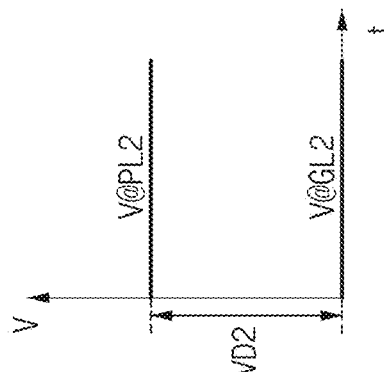
Figure 4A:
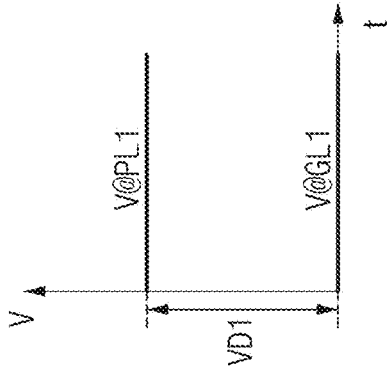

Referring to FIG. 4A, an example of voltages of the power lines and voltages of the ground lines is illustrated in an initial operation time, e.g., immediately after the probe card 10a and the first, second, third and fourth DUTs DUT1, DUT2, DUT3 and DUT4 are electrically connected.

The first, second, third and fourth power compensation circuits may respectively generate first, second, third and fourth compensated power supply voltages VCP1, VCP2, VCP3 and VCP4 having fixed (or constant) voltage levels. Thus, each of a voltage V@PL1 of the first power line PL1, a voltage V@PL2 of the second power line PL2, a voltage V@PL3 of the third power line PL3, and a voltage V@PL4 of the fourth power line PL4 may have a fixed voltage level. In addition, there may be no variations in a voltage V@GL1 of the first ground line GL1, a voltage V@GL2 of the second ground line GL2, a voltage V@GL3 of the third ground line GL3, and a voltage V@GL4 of the fourth ground line GL4.

Therefore, a first voltage difference VD1 between the voltage V@PL1 of the first power line PL1 and the voltage V@GL1 of the first ground line GL1 may be fixed or maintained constant, a second voltage difference VD2 between the voltage V@PL2 of the second power line PL2 and the voltage V@GL2 of the second ground line GL2 may be fixed or maintained constant, a third voltage difference VD3 between the voltage V@PL3 of the third power line PL3 and the voltage V@GL3 of the third ground line GL3 may be fixed or maintained constant, and a fourth voltage difference VD4 between the voltage V@PL4 of the fourth power line PL4 and the voltage V@GL4 of the fourth ground line GL4 may be fixed or maintained constant.

Figure 4B:
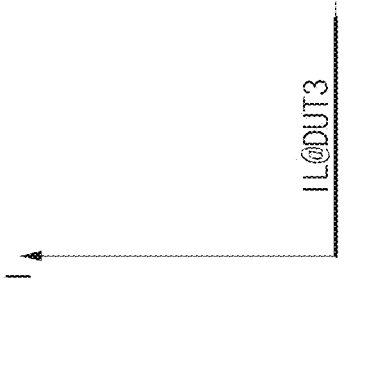
Figure 4B:
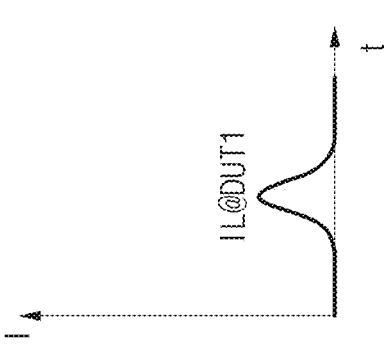

Referring to FIGS. 4B and 4C, while the probe card is operating, e.g., during the test operation on the first DUT1, an example of variations in load currents of DUTs and an example of variations in the voltages of the ground lines are illustrated.

When the test operation is performed on the first DUT1, the first DUT1 may instantaneously consume or receive current, and a load current IL@DUT1 of the first DUT1 may instantaneously increase. The test operation on one DUT may be performed at a single point in time, and the first, second, third and fourth DUTs DUT1, DUT2, DUT3 and DUT4 may be sequentially tested over time. Thus, while the test operation is performed on the first DUT1, the test operations may not be performed on the second, third and fourth DUTs DUT2, DUT3 and DUT4, and a load current IL@DUT2 of the second DUT2, a load current IL@DUT3 of the third DUT3, and a load current IL@DUT4 of the fourth DUT4 may be maintained without variations or changes.

When the load current IL@DUT1 of the first DUT1 instantaneously increases, the voltage V@GL1 of the first ground line GL1 connected to the first DUT1 may instantaneously increase. For example, the voltage V@GL1 of the first ground line GL) may momentarily increase by a first voltage level (or a first amount of voltage change) ΔV1.

As described above, the first, second, third and fourth ground lines GL1, GL2, GL3 and GL4 may be connected to each other. Therefore, when the voltage V@GL1 of the first ground line GL1 instantaneously increases, the voltage V@GL2 of the second ground line GL2, the voltage V@GL3 of the third ground line GL3, and the voltage V@GL4 of the fourth ground line GL4 may also instantaneously increase. For example, the voltage V@GL2 of the second ground line GL2 may momentarily increase by a second voltage level ΔV2, the voltage V@GL3 of the third ground line GL3 may momentarily increase by a third voltage level ΔV3, and the voltage V@GL4 of the fourth ground line GL4 may momentarily increase by a fourth voltage level ΔV4.

In some example embodiments, the amount of voltage change in the ground line that is not directly connected to the DUT on which the test operation is performed may be smaller than the amount of voltage change in the ground line that is directly connected to the DUT on which the test operation is performed. For example, the second voltage level ΔV2, the third voltage level ΔV3, and the fourth voltage level ΔV4 may be smaller than the first voltage level ΔV1 (e.g., ΔV1>ΔV2, ΔV1>ΔV3, and ΔV1>ΔV4).

In some example embodiments, among the ground lines that are not directly connected to the DUT on which the test operation is performed, the amount of voltage change in the ground line may decrease as a distance from the ground line that is directly connected to the DUT on which the test operation is performed increases. For example, a distance between the first ground line GL1 and the second ground line GL2 may be a first distance, a distance between the first ground line GL1 and the third ground line GL3 may be a second distance longer than the first distance, and a distance between the first ground line GL1 and the fourth ground line GL4 may be a third distance longer than the second distance. In other words, among the second, third and fourth ground lines GL2, GL3 and GL4, the second ground line GL2 may be closest to the first ground line GL1, and the fourth ground line GL4 may be farthest from the first ground line GL1. In this case, the third voltage level ΔV3 may be smaller than the second voltage level ΔV2, and the fourth voltage level ΔV4 may be smaller than the third voltage level ΔV3 (e.g., ΔV1>ΔV2>ΔV3>ΔV4).

Figure 4D:
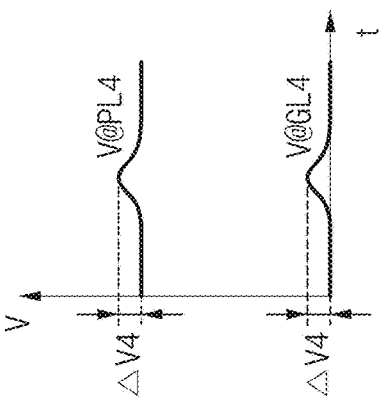
Figure 4D:
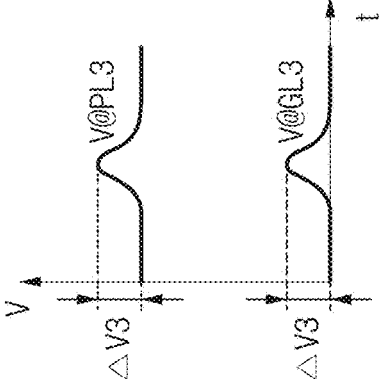
Figure 4D:
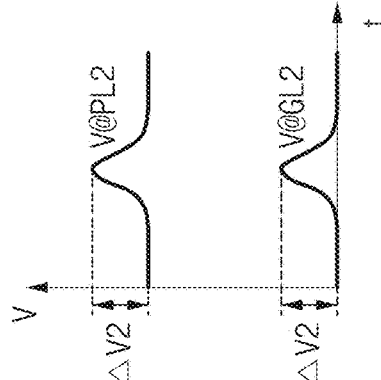
Figure 4D:
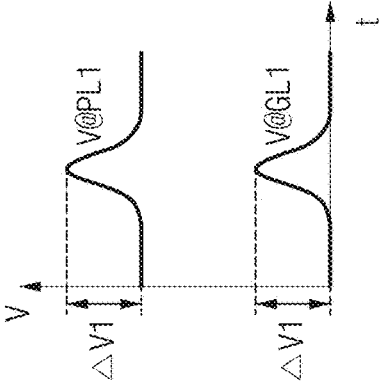

Referring to FIG. 4D, after the load current IL@DUT1 of the first DUT1 instantaneously increase as described with reference to FIGS. 4B and 4C, an example of variations in the voltages of the power lines is illustrated.

The first subtractor SUB1 included in the first power compensation circuit may detect the variation in the voltage V@GL1 of the first ground line GL1 to generate the first sensing signal SEN1. The first linear regulator LDO1 included in the first power compensation circuit may generate the first compensated power supply voltage VCP1 based on the first sensing signal SEN1 such that the voltage V@PL1 of the first power line PL1 instantaneously increases by the first voltage level ΔV1 as with the voltage V@GL1 of the first ground line GL1. Thus, even though the variation in the voltage V@GL1 of the first ground line GL1 occurs, the first voltage difference VD1 between the voltage V@PL1 of the first power line PL1 and the voltage V@GL1 of the first ground line GL1 may be maintained constant.

Similarly, in the second power compensation circuit, the second subtractor SUB2 may detect the variation in the voltage V@GL2 of the second ground line GL2 to generate the second sensing signal SEN2, and the second linear regulator LDO2 may generate the second compensated power supply voltage VCP2 based on the second sensing signal SEN2 such that the voltage V@PL2 of the second power line PL2 instantaneously increases by the second voltage level ΔV2. Thus, even though the variation in the voltage V@GL2 of the second ground line GL2 occurs, the second voltage difference VD2 may be maintained constant.

In addition, in the third power compensation circuit, the third subtractor SUB3 may detect the variation in the voltage V@GL3 of the third ground line GL3 to generate the third sensing signal SEN3, and the third linear regulator LDO3 may generate the third compensated power supply voltage VCP3 based on the third sensing signal SEN3 such that the voltage V@PL3 of the third power line PL3 instantaneously increases by the third voltage level ΔV3. Thus, even though the variation in the voltage V@GL3 of the third ground line GL3 occurs, the third voltage difference VD3 may be maintained constant.

In the fourth power compensation circuit, the fourth subtractor SUB4 may detect the variation in the voltage V@GL4 of the fourth ground line GL4 to generate the fourth sensing signal SEN4, and the fourth linear regulator LDO4 may generate the fourth compensated power supply voltage VCP4 based on the fourth sensing signal SEN4 such that the voltage V@PL4 of the fourth power line PL4 instantaneously increases by the fourth voltage level ΔV4. Thus, even though the variation in the voltage V@GL4 of the fourth ground line GL4 occurs, the fourth voltage difference VD4 may be maintained constant.

As described above, the first, second, third and fourth voltage differences VD1, VD2, VD3 and VD4 may be maintained constant using the first, second, third and fourth power compensation circuits, and thus the power interference between the first, second, third and fourth DUTs DUT1, DUT2, DUT3 and DUT4 may be efficiently prevented or inhibited.

Although the operations when the test operation is performed on the first DUT1 are described with reference to FIGS. 4A, 4B, 4C and 4D, example embodiments are not limited thereto. For example, when the test operation is performed on one of the second, third and fourth DUTs (DUT2, DUT3 and DUT4), operations similar to those described with reference to FIGS. 4A, 4B, 4C and 4D may be performed.

Figure 5:
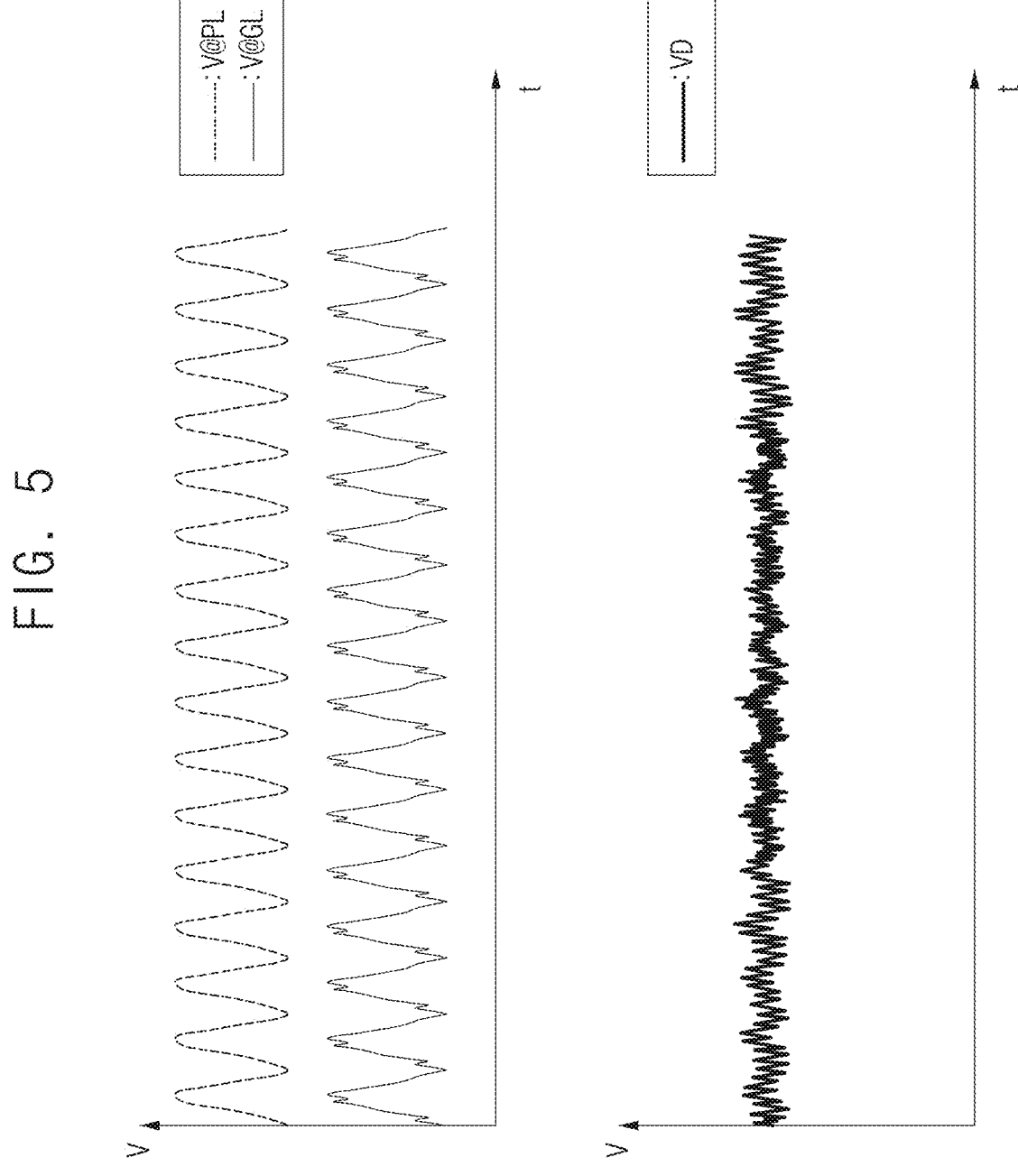

Referring to FIG. 5, an example of a simulation result for the probe card and the power compensation circuit included therein according to example embodiments is illustrated.

As illustrated in FIG. 5, it can be seen that a voltage V@PL of the power line changes to correspond to a variation in a voltage V@GL of the ground line, a voltage difference VD between the voltage V@PL of the power line and the voltage V@GL of the ground line is maintained constant, and the ground noise is canceled out or inhibited.

Figure 6A:
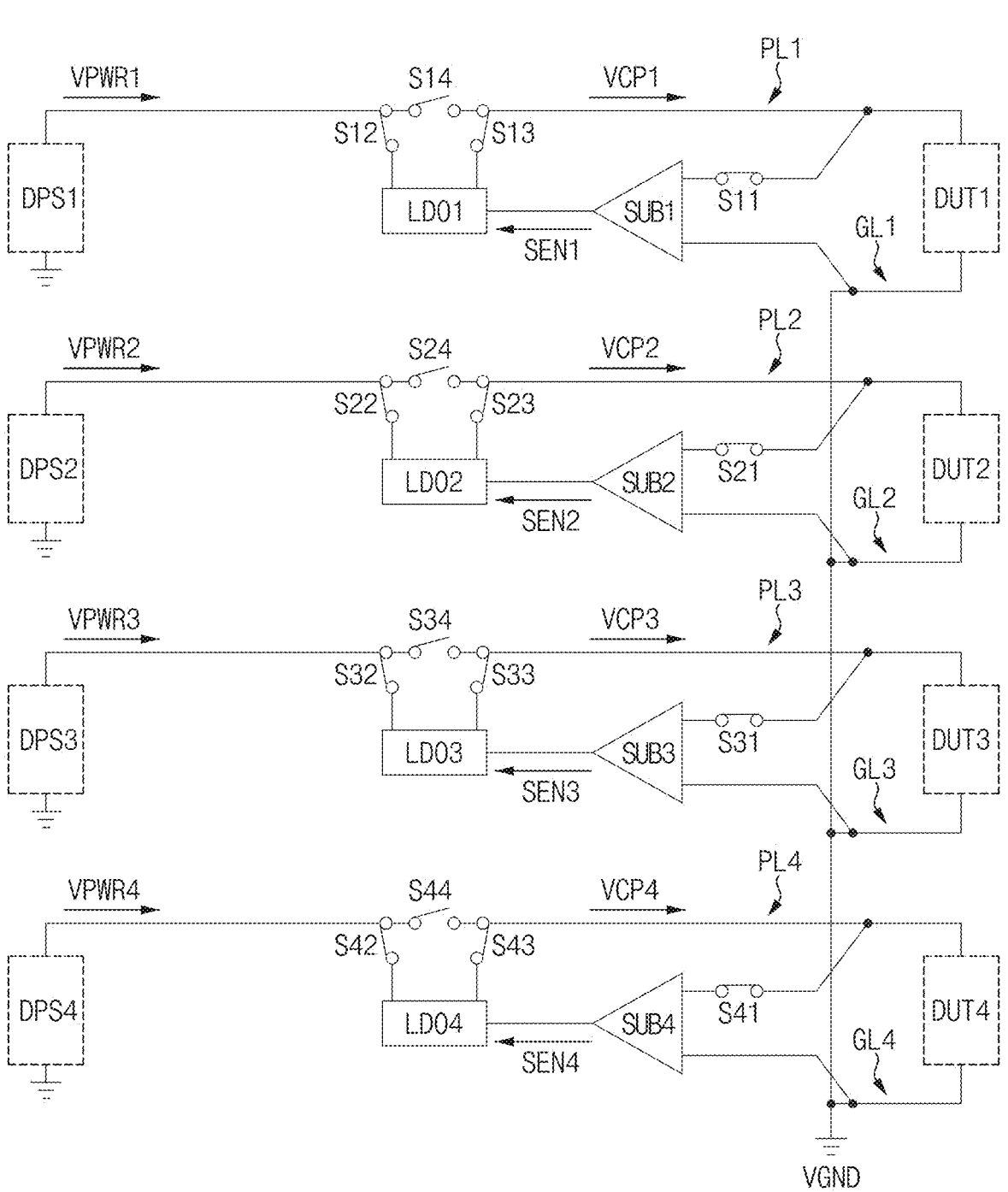
FIGS. 6A and 6B are block diagrams illustrating an example of a probe card of FIG. 1.
Figure 6B:
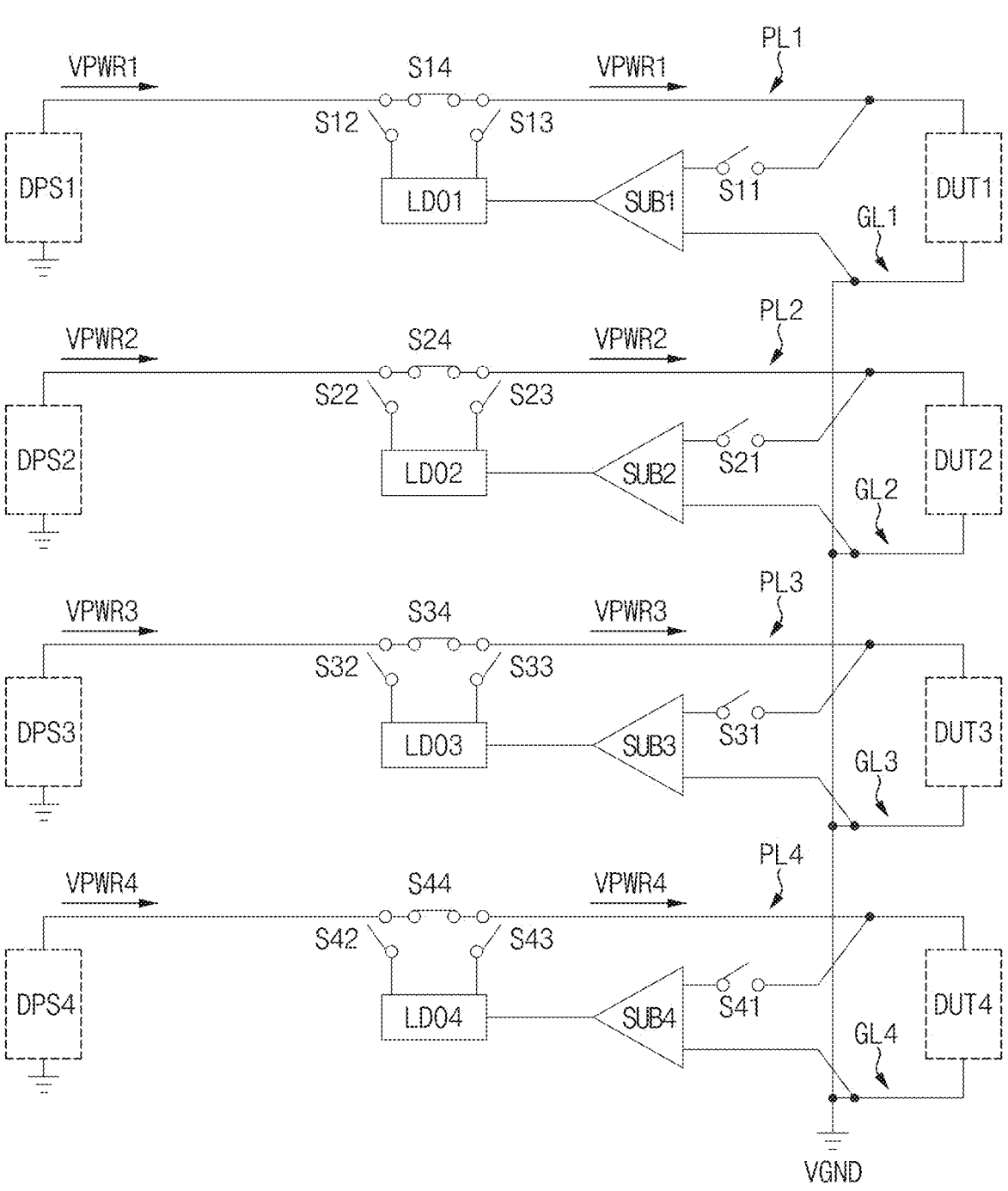

FIGS. 6A and 6B are block diagrams illustrating an example of a probe card of FIG. 1. The descriptions repeated with or overlapping with descriptions of FIG. 3 will be omitted in the interest of brevity.

Referring to FIGS. 6A and 6B, a probe card 10b may include first, second, third and fourth power lines PL1, PL2, PL3 and PL4, first, second, third and fourth ground lines GL1, GL2, GL3 and GL4, first, second, third and fourth power compensation circuits, and a plurality of switches S11, S12, S13, S14, S21, S22, S23, S24, S31, S32, S33, S34, S41, S42, S43 and S44.

The probe card 10b may be substantially the same as the probe card 10a of FIG. 3, except that the probe card 10b further includes the plurality of switches S11, S12, S13, S14, S21, S22, S23, S24, S31, S32, S33, S34, S41, S42, S43 and S44.

The plurality of switches S11, S12, S13, S14, S21, S22, S23, S24, S31, S32, S33, S34, S41, S42, S43 and S44 may control electrical connections between the first, second, third and fourth power lines PL1, PL2, PL3 and PL4 and the first, second, third and fourth power compensation circuits. For example, each of the plurality of switches S11, S12, S13, S14, S21, S22, S23, S24, S31, S32, S33, S34, S41, S42, S43 and S44 may be a single pole single throw (SPST) switch.

The first channel of the probe card 10b may further include the switches S11, S12, S13 and S14. The switch S11 may be disposed between the first power line PL1 and an input terminal of the first subtractor SUB1. The switch S12 may be disposed between the first power line PL1 and an input terminal of the first linear regulator LDO1. The switch S13 may be disposed between the first power line PL1 and an output terminal of the first linear regulator LDO1. The switch S14 may be disposed on the first power line PL1 between the switch S12 and the switch S13.

The second channel of the probe card 10b may further include the switches S21, S22, S23 and S24. The switch S21 may be disposed between the second power line PL2 and an input terminal of the second subtractor SUB2. The switch S22 may be disposed between the second power line PL2 and an input terminal of the second linear regulator LDO2. The switch S23 may be disposed between the second power line PL2 and an output terminal of the second linear regulator LDO2. The switch S24 may be disposed on the second power line PL2 between the switch S22 and the switch S23.

The third channel of the probe card 10b may further include the switches S31, S32, S33 and S34. The switch S31 may be disposed between the third power line PL3 and an input terminal of the third subtractor SUB3. The switch S32 may be disposed between the third power line PL3 and an input terminal of the third linear regulator LDO3. The switch S33 may be disposed between the third power line PL3 and an output terminal of the third linear regulator LDO3. The switch S34 may be disposed on the third power line PL3 between the switch S32 and the switch S33.

The fourth channel of the probe card 10b may further include the switches S41, S42, S43 and S44. The switch S41 may be disposed between the fourth power line PL4 and an input terminal of the fourth subtractor SUB4. The switch S42 may be disposed between the fourth power line PL4 and an input terminal of the fourth linear regulator LDO4. The switch S43 may be disposed between the fourth power line PL4 and an output terminal of the fourth linear regulator LDO4. The switch S44 may be disposed on the fourth power line PL4 between the switch S42 and the switch S43.

In some example embodiments, an operation mode of the probe card 10b may be changed depending on operations of turning on and off the plurality of switches S11, S12, S13, S14, S21, S22, S23, S24, S31, S32, S33, S34, S41, S42, S43 and S44.

For example, as illustrated in FIG. 6A, when the switches S11, S12, S13, S21, S22, S23, S31, S32, S33, S41, S42 and S44 are closed (e.g., turned on) and the switches S14, S24, S34 and S44 are opened (e.g., turned off), the probe card 10b may operate in a first operation mode. In the first operation mode, the first, second, third and fourth power compensation circuits may be enabled or activated, and the first, second, third and fourth compensated power supply voltages VCP1, VCP2, VCP3 and VCP4 may be provided as power to the first, second, third and fourth DUTs DUT1, DUT2, DUT3 and DUT4. In other words, in the first operation mode, the probe card 10b may operate substantially the same as the probe card 10a of FIG. 3.

For example, as illustrated in FIG. 6B, when the switches S11, S12, S13, S21, S22, S23, S31, S32, S33, S41, S42 and S44 are opened and the switches S14, S24, S34 and S44 are opened closed, the probe card 10b may operate in a second operation mode. In the second operation mode, the first, second, third and fourth power compensation circuits may be disabled or deactivated, and the first, second, third, and fourth power supply voltages VPWR1, VPWR2, VPWR3 and VPWR4 may be provided as power to the first, second, third, and fourth DUTs DUT1, DUT2, DUT3 and DUT4.

In some example embodiments, in an environment that is relatively sensitive to noise, the probe card 10b may operate in the first operation mode for canceling out or inhibiting the ground noise. In an environment that is relatively insensitive to noise, the probe card 10b may operate in the second operation mode without driving the power compensation circuits.

In some example embodiments, the plurality of switches S11, S12, S13, S14, S21, S22, S23, S24, S31, S32, S33, S34, S41, S42, S43 and S44 may be turned on and off by external control. For example, the plurality of switches S11, S12, S13, S14, S21, S22, S23, S24, S31, S32, S33, S34, S41, S42, S43 and S44 may be turned on and off by an automatic test equipment (ATE) included in a test system including the probe card 10b.

Figure 7:
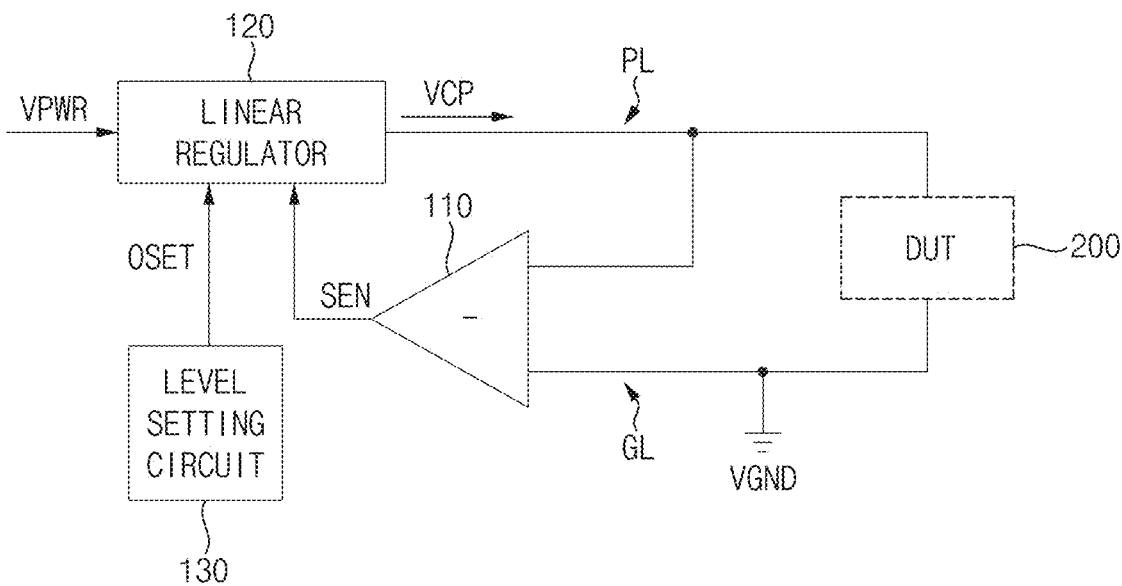
FIG. 7 is a block diagram illustrating an example of a power compensation circuit included in a probe card according to example embodiments.

FIG. 7 is a block diagram illustrating an example of a power compensation circuit included in a probe card according to example embodiments. The descriptions repeated with or overlapping with descriptions of FIG. 2 will be omitted in the interest of brevity.

Referring to FIG. 7, a power compensation circuit 100-2 may be connected to a DUT 200, and may include a subtractor 110, a linear regulator 120 and a level setting circuit 130.

The power compensation circuit 100-2 may be substantially the same as the power compensation circuit 100-1 of FIG. 2, except that the power compensation circuit 100-2 further includes the level setting circuit 130.

The level setting circuit 130 may generate an output setting signal OSET for setting an output voltage level of the linear regulator 120. The linear regulator 120 may set and change a voltage level of the compensated power supply voltage VCP based on the output setting signal OSET. For example, the output voltage level of the linear regulator 120 may be set by external control.

In some example embodiments, the level setting circuit 130 may include at least one of various components such as a digital-to-analog converter (DAC), etc.

In some example embodiments, each of the power compensation circuits included in the probe card 10a of FIG. 3 and the probe card 10b of FIGS. 6A and 6B may be the power compensation circuit 100-2 of FIG. 7. For example, the first, second, third and fourth power compensation circuits may further include first, second, third and fourth level setting circuits, respectively. For example, each of the first, second, third and fourth level setting circuits may include a DAC.

Figure 8:
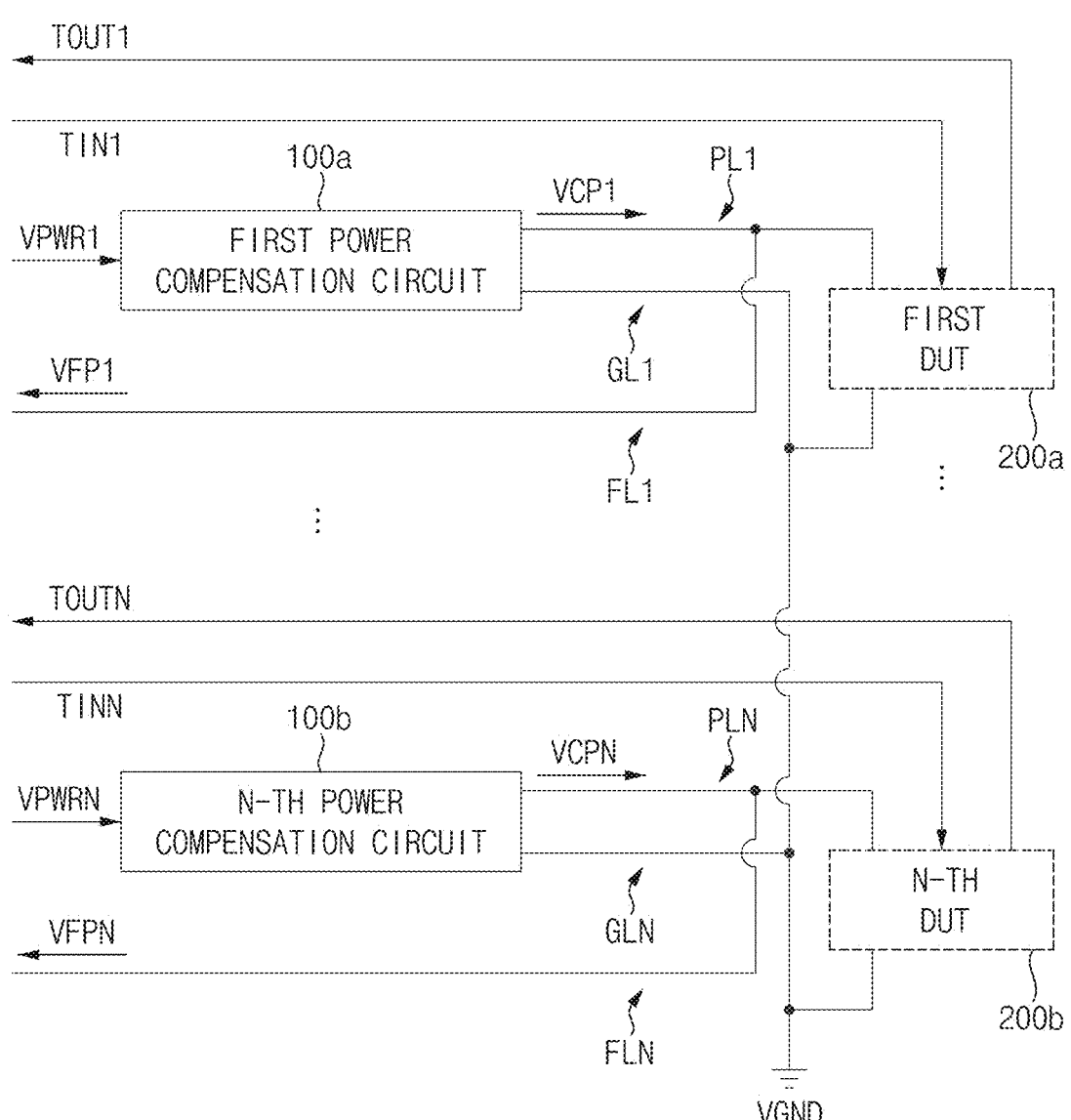
FIG. 8 is a block diagram illustrating a probe card according to example embodiments.

FIG. 8 is a block diagram illustrating a probe card according to example embodiments. The descriptions repeated with or overlapping with descriptions of FIG. 1 will be omitted in the interest of brevity.

Referring to FIG. 8, a probe card 12 includes a plurality of power lines PL1, . . . , PLN, a plurality of ground lines GL1, . . . , GLN, a plurality of power compensation circuits 100a, . . . , 100b, and a plurality of feedback lines FL1, . . . , FLN.

The probe card 12 may be substantially the same as the probe card 10 of FIG. 1, except that the probe card 12 further includes the plurality of feedback lines FL1, . . . , FLN.

The plurality of feedback lines FL1, . . . , FLN may be connected to the plurality of power lines PL1, . . . , PLN. For example, the plurality of feedback lines FL1, . . . , FLN may include the first feedback line FL1 to the N-th feedback line FLN. For example, the first feedback line FL1 may be connected to the first power line PL1, and the N-th feedback line FLN may be connected to the N-th power line PLN.

A plurality of feedback power supply voltages VFP1, . . . , VFPN may be output to an outside of the probe card 12 (e.g., to an external device located outside the probe card 12) through the plurality of feedback lines FL1, . . . , FLN. For example, the plurality of feedback power supply voltages VFP1, . . . , VFPN may include the first feedback power supply voltage VFP1 to the N-th feedback power supply voltage VFPN. For example, the first feedback power supply voltage VFP1 may be output to the outside through the first feedback line FL1, and the N-th feedback power supply voltage VFPN may be output to the outside through the N-th feedback line FLN. The plurality of feedback power supply voltages VFP1, . . . , VFPN may be used to adjust the voltage levels of the plurality of power supply voltages VPWR1, . . . , VPWRN.

Figure 9:
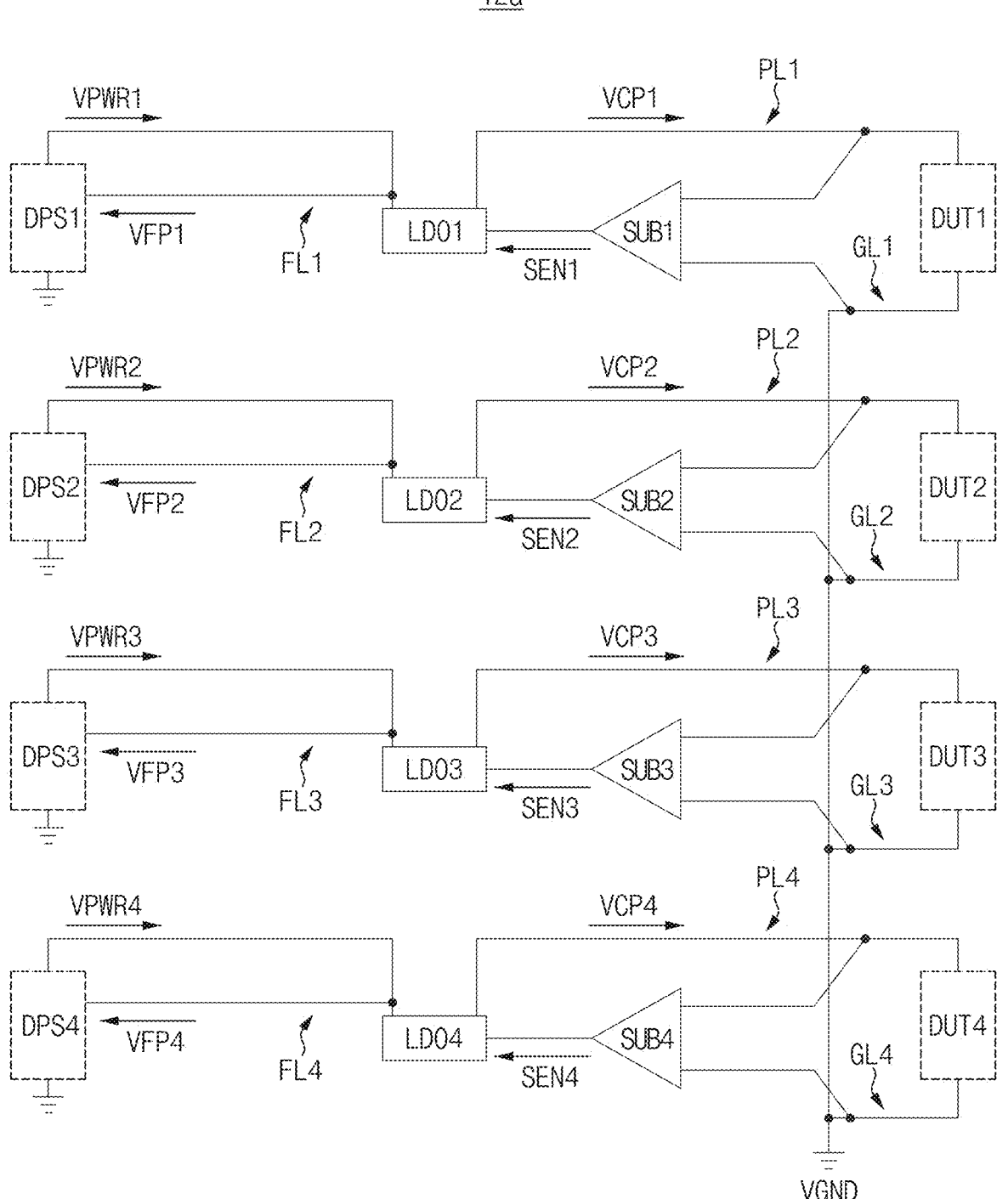
FIGS. 9, 10A and 10B are block diagrams illustrating examples of a probe card of FIG. 8.
Figure 10A:
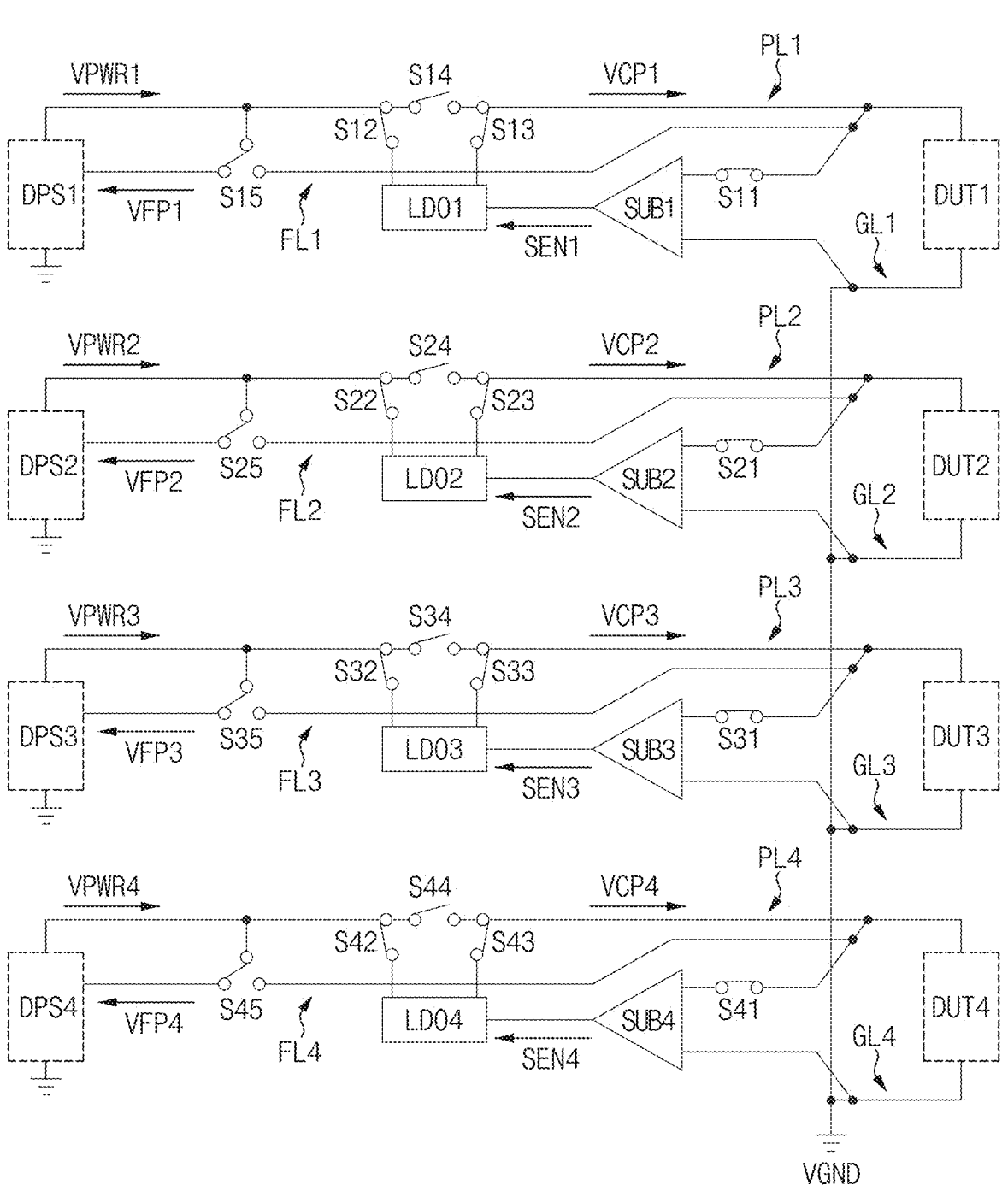
Figure 10B:
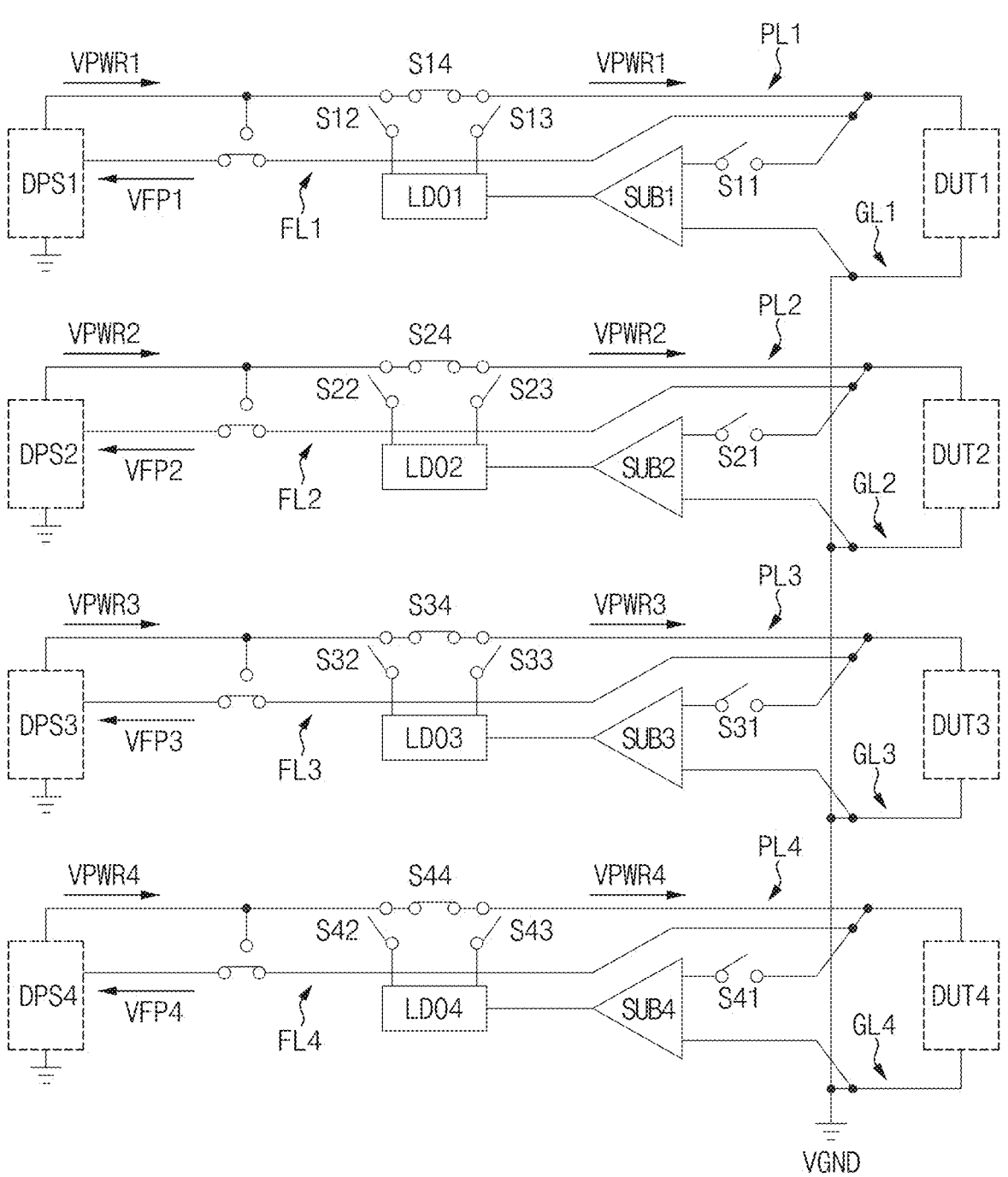

FIGS. 9, 10A and 10B are block diagrams illustrating examples of a probe card of FIG. 8. The descriptions repeated with or overlapping with descriptions of FIGS. 3, 6A and 6B will be omitted in the interest of brevity.

Referring to FIG. 9, a probe card 12a may include first, second, third and fourth power lines PL1, PL2, PL3 and PL4, first, second, third and fourth ground lines GL1, GL2, GL3 and GL4, first, second, third and fourth power compensation circuits, and first, second, third and fourth feedback lines FL1, FL2, FL3 and FL4.

The probe card 12a may be substantially the same as the probe card 10a of FIG. 3, except that the probe card 12a further includes the first, second, third and fourth feedback lines FL1, FL2, FL3 and FL4.

The first channel of the probe card 10b may further include the first feedback line FL1 that is connected to a front end of the first power line PL1, e.g., a line to which the first power supply voltage VPWR1 is supplied. A first feedback power supply voltage VFP1 may be provided to the first power supply circuit DPS1 through the first feedback line FL1. The first power supply circuit DPS1 may adjust the voltage level of the first power supply voltage VPWR1 based on the first feedback power supply voltage VFP1. For example, a voltage drop on the first power supply voltage VPWR1 may be compensated based on the first feedback power supply voltage VFP1.

The second channel of the probe card 10b may further include the second feedback line FL2 that is connected to a front end of the second power line PL2, e.g., a line to which the second power supply voltage VPWR2 is supplied. A second feedback power supply voltage VFP2 may be provided to the second power supply circuit DPS2 through the second feedback line FL2. The second power supply circuit DPS2 may adjust the voltage level of the second power supply voltage VPWR2 based on the second feedback power supply voltage VFP2 (e.g., to compensate a voltage drop on the second power supply voltage VPWR2).

The third channel of the probe card 10b may further include the third feedback line FL3 that is connected to a front end of the third power line PL3, e.g., a line to which the third power supply voltage VPWR3 is supplied. A third feedback power supply voltage VFP3 may be provided to the third power supply circuit DPS3 through the third feedback line FL3. The third power supply circuit DPS3 may adjust the voltage level of the third power supply voltage VPWR3 based on the third feedback power supply voltage VFP3 (e.g., to compensate a voltage drop on the third power supply voltage VPWR3).

The fourth channel of the probe card 10b may further include the fourth feedback line FL4 that is connected to a front end of the fourth power line PL4, e.g., a line to which the fourth power supply voltage VPWR4 is supplied. A fourth feedback power supply voltage VFP4 may be provided to the fourth power supply circuit DPS4 through the fourth feedback line FL4. The fourth power supply circuit DPS4 may adjust the voltage level of the fourth power supply voltage VPWR4 based on the fourth feedback power supply voltage VFP4 (e.g., to compensate a voltage drop on the fourth power supply voltage VPWR4).

Referring to FIGS. 10A and 10B, a probe card 12b may include first, second, third and fourth power lines PL1, PL2, PL3 and PL4, first, second, third and fourth ground lines GL1, GL2, GL3 and GL4, first, second, third and fourth power compensation circuits, first, second, third and fourth feedback lines FL1, FL2, FL3 and FL4, and a plurality of switches S11, S12, S13, S14, S15, S21, S22, S23, S24, S25, S31, S32, S33, S34, S35, S41, S42, S43, S44 and S45.

The probe card 12b may be substantially the same as the probe card 12a of FIG. 9, except that the probe card 12b further includes the plurality of switches S11, S12, S13, S14, S15, S21, S22, S23, S24, S25, S31, S32, S33, S34, S35, S41, S42, S43, S44 and S45.

The switches S11, S12, S13, S14, S21, S22, S23, S24, S31, S32, S33, S34, S41, S42, S43 and S44 may be substantially the same as those described with reference to FIGS. 6A and 6B. The switches S15, S25, S35 and S45 may control electrical connections between the first, second, third and fourth power lines PL1, PL2, PL3 and PL4 and the first, second, third and fourth feedback lines FL1, FL2, FL3 and FL4. For example, each of the switches S15, S25, S35 and S45 may be a single pole double throw (SPDT) switch.

The first channel of the probe card 10b may further include the switch S15, the second channel of the probe card 10b may further include the switch S25, the third channel of the probe card 10b may further include the switch S35, and the fourth channel of the probe card 10b may further include the switch S45. The switch S15 may be disposed between the first power line PL1 and the first feedback line FL1, the switch S25 may be disposed between the second power line PL2 and the second feedback line FL2, the switch S35 may be disposed between the third power line PL3 and the third feedback line FL3, and the switch S45 may be disposed between the fourth power line PL4 and the fourth feedback line FL4.

In some example embodiments, an operation mode of the probe card 12b may be changed depending on operations of turning on and off the plurality of switches S11, S12, S13, S14, S15, S21, S22, S23, S24, S25, S31, S32, S33, S34, S35, S41, S42, S43, S44 and S45.

For example, when the plurality of switches S11, S12, S13, S14, S15, S21, S22, S23, S24, S25, S31, S32, S33, S34, S35, S41, S42, S43, S44 and S45 are closed and opened as illustrated in FIG. 10A, the probe card 12b may operate in a first operation mode as with the example of FIG. 6A, and may operate substantially the same as the probe card 12a of FIG. 9. For example, the first, second, third and fourth power lines PL1, PL2, PL3 and PL4 and the first, second, third and fourth feedback lines FL1, FL2, FL3 and FL4 may be connected to each other at relatively close points by the switches S15, S25, S35 and S45.

For example, when the plurality of switches S11, S12, S13, S14, S15, S21, S22, S23, S24, S25, S31, S32, S33, S34, S35, S41, S42, S43, S44 and S45 are closed and opened as illustrated in FIG. 10B, the probe card 12b may operate in a second operation mode as with the example of FIG. 6B. For example, the first, second, third and fourth power lines PL1, PL2, PL3 and PL4 and the first, second, third and fourth feedback lines FL1, FL2, FL3 and FL4 may be connected at relatively far points as compared with FIG. 10A (e.g., at points closest to the first, second, third and fourth DUTs DUT1, DUT2, DUT3 and DUT4).

Figure 11:
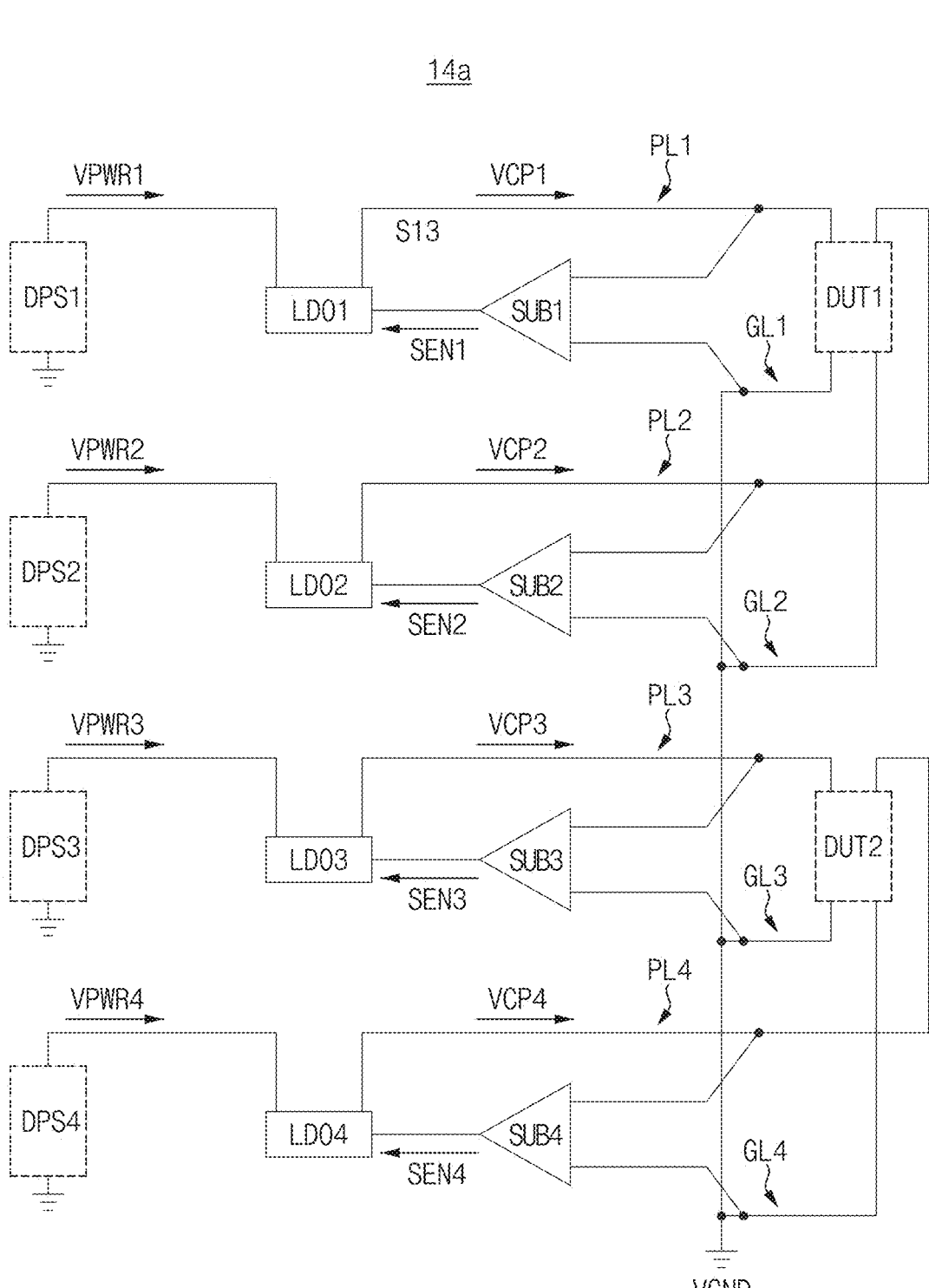
FIG. 11 is a block diagram illustrating an example of a probe card of FIG. 1.

FIG. 11 is a block diagram illustrating an example of a probe card of FIG. 1. The descriptions repeated with or overlapping with descriptions of FIG. 3 will be omitted in the interest of brevity.

Referring to FIG. 11, a probe card 14a may include first, second, third and fourth power lines PL1, PL2, PL3 and PL4, first, second, third and fourth ground lines GL1, GL2, GL3 and GL4, and first, second, third and fourth power compensation circuits.

The probe card 14*a* may be substantially the same as the probe card 10*a* of FIG. 3, except that the number of channels included in the probe card 14*a* is different from the number of DUTs connected to the probe card 14*a*.

FIG. 11 illustrates an example where the number of DUTs is less than the number of channels. For example, FIG. 11 illustrates an example where two or more channels are connected to one DUT, e.g., an example where one DUT is supplied with two or more power supply voltages. For example, the first channel of the probe card 14*a* may be connected to the first DUT1 through the first power line PL1 and the first ground line GL1, and the second channel of the probe card 14*a* may be connected to the first DUT1 through the second power line PL2 and the second ground line GL2. The third channel of the probe card 14*a* may be connected to the second DUT2 through the third power line PL3 and the third ground line GL3, and the fourth channel of the probe card 14*a* may be connected to the second DUT2 through the fourth power line PL4 and the fourth ground line GL4.

Although not illustrated in detail, the probe card 10*b* of FIG. 6, the probe card 12*a* of FIG. 9, and the probe card 12*b* of FIG. 10 may also be implemented as described with reference to FIG. 11.

Although example embodiments are described based on examples where the probe card includes four channels, example embodiments are not limited thereto, and the number of channels in the probe card may be variously determined according to example embodiment. In addition, although example embodiments are described based on examples where one DUT is connected to one or two channels included in the probe card, example embodiments are not limited thereto, and the number of channels in the probe card connected to one DUT may be variously determined according to example embodiment.

Figure 12:
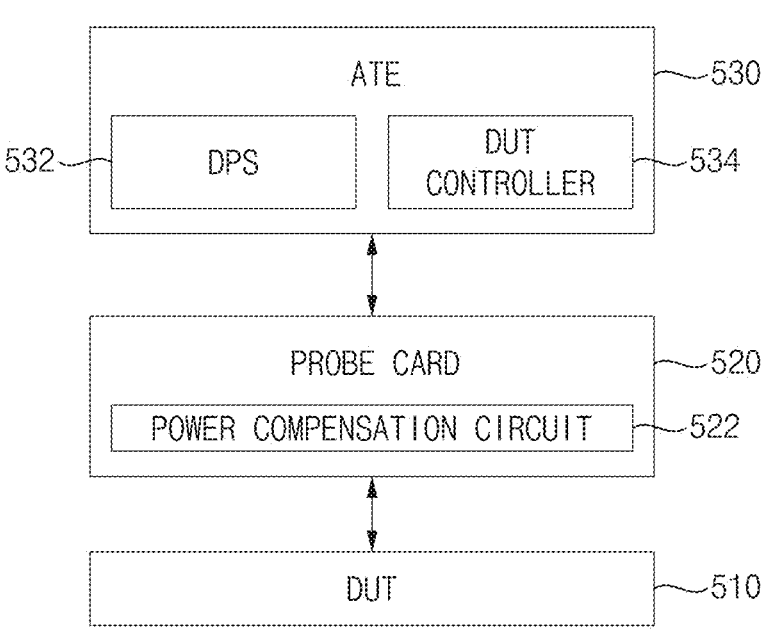
FIG. 12 is a block diagram illustrating a test system according to example embodiments.

FIG. 12 is a block diagram illustrating a test system according to example embodiments.

Referring to FIG. 12, a test system 500 includes a plurality of DUTs 510 as test targets, a probe card 520 and an automatic test equipment (ATE) 530.

The probe card 520 contacts the plurality of DUTs 510. For example, as will be described with reference to FIGS. 13A and 13B, the probe card 520 may be directly electrically connected to the plurality of DUTs 510 using a plurality of probes.

The probe card 520 may be the probe card according to example embodiments described with reference to FIGS. 1 through 11, and may include a plurality of power compensation circuits 522. The plurality of power compensation circuits 522 may detect and compensate for voltage variations of a plurality of ground lines connected to the plurality of DUTs 510 in real-time. Accordingly, the power supplied to the plurality of DUTs 510 may be maintained at a constant level, and the yield degradation may be prevented or inhibited even when the plurality of DUTs 510 are tested simultaneously.

In some example embodiments, the probe card 520 may be one of a cantilever probe card, a vertical probe card, a membrane probe card and a micro-electric-mechanical systems (MEMS) probe card.

The ATE 530 is electrically connected to the plurality of DUTs 510 through the probe card 520, and tests the plurality of DUTs 510.

The ATE 530 may include a plurality of power supply circuits 532 and a DUT controller 534.

The plurality of power supply circuits 532 may provide a plurality of power supply voltages. For example, the first, second, third and fourth power supply circuits DPS1, DPS2, DPS3 and DPS4 in FIG. 3 may correspond to the plurality of power supply circuits 532. For example, the plurality of power compensation circuits 522 may generate a plurality of compensated power supply voltages based on the plurality of power supply voltages and provide the plurality of compensated power supply voltages to the plurality of DUTs 510. For another example, as described with reference to FIGS. 6A, 6B, 10A and 10B, the plurality of power supply voltages, rather than the plurality of compensated power supply voltages, may be provided as power to the plurality of DUTs 510 in a specific operation mode.

The DUT controller 534 may control operations of the plurality of DUTs 510. Although not illustrated in detail, the DUT controller 534 may receive test results from the plurality of DUTs 510 and may transmit the test results to an external computing device, and the external computing device may analyze the test results.

Figure 13A:
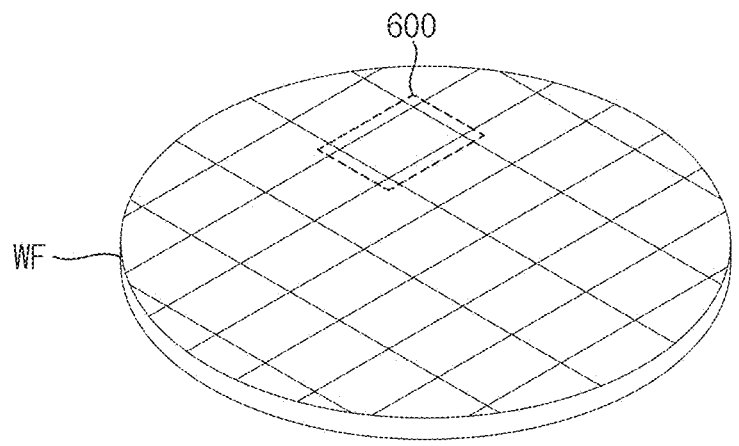
FIGS. 13A, 13B and 14 are diagrams illustrating an example of a DUT and a probe card that are included in a test system according to example embodiments.
Figure 13B:
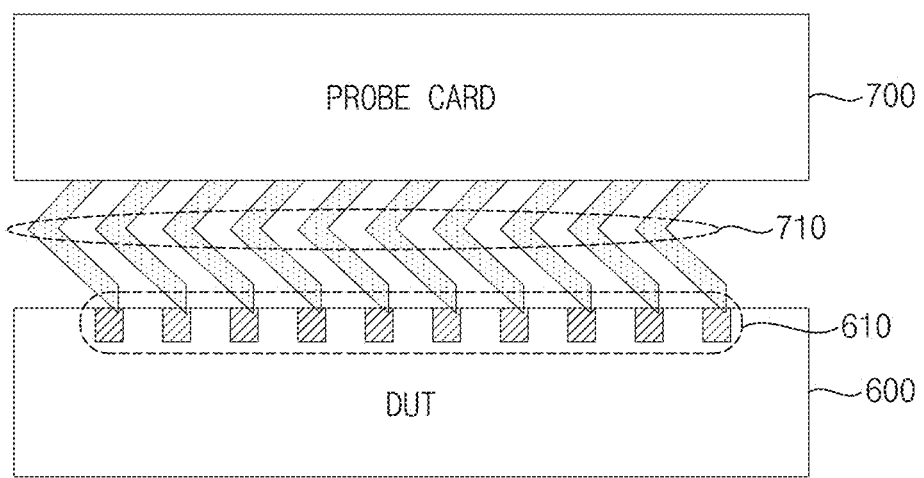
Figure 14:
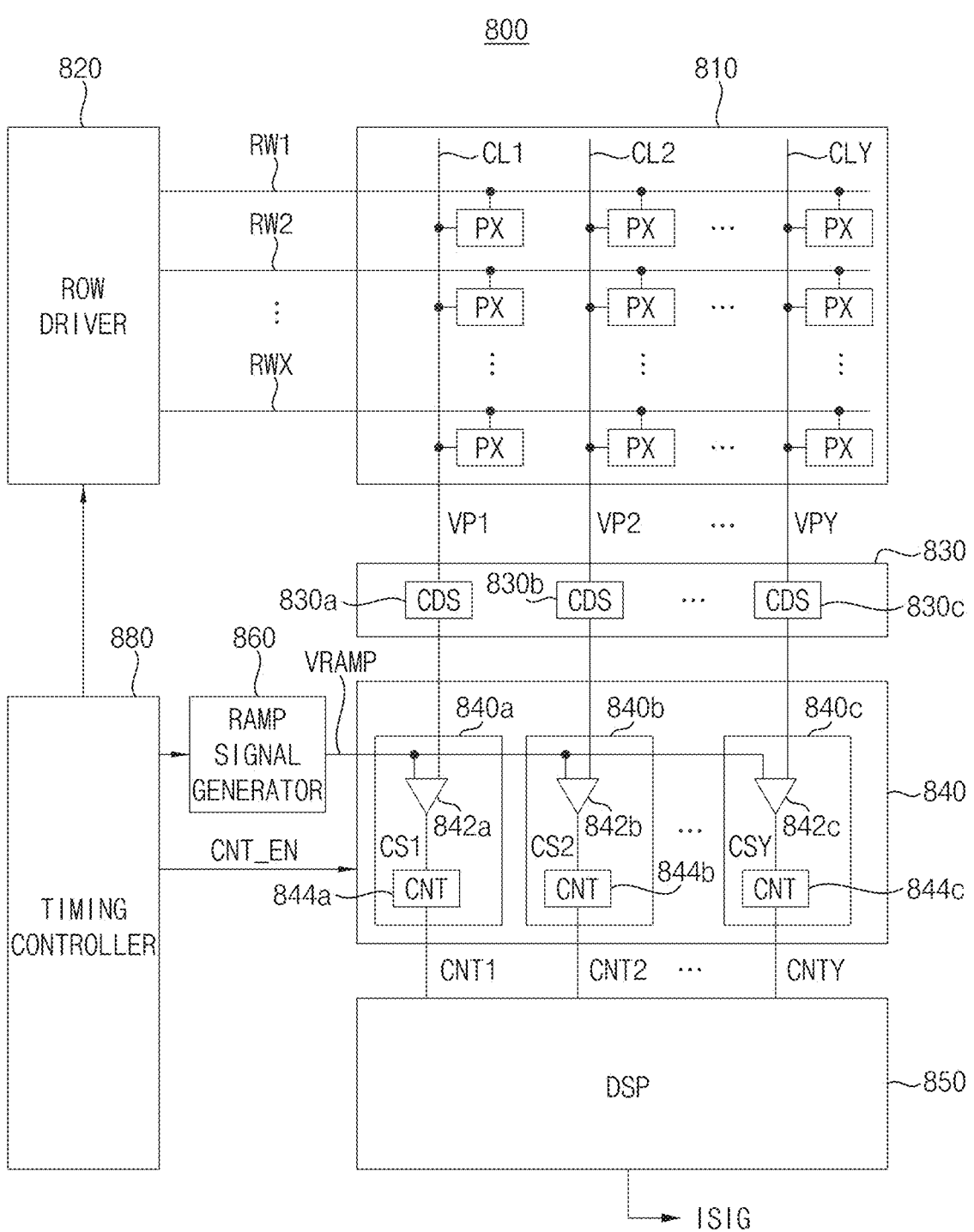

FIGS. 13A, 13B and 14 are diagrams illustrating an example of a DUT and a probe card that are included in a test system according to example embodiments.

Referring to FIG. 13A, a plurality of semiconductor integrated circuits may be formed and disposed on a wafer WF. The plurality of semiconductor integrated circuits and the wafer WF including the plurality of semiconductor integrated circuits may be provided to the test system as a plurality of DUTs 600.

Referring to FIG. 13B, each DUT 600 may include a plurality of pads 610, and a probe card 700 may include a plurality of probes 710.

For example, the plurality of pads 610 may include at least one input pad that receives a test input signal (e.g., the test input signal TIN1 in FIG. 1), at least one output pad that outputs a test output signal (e.g., the test output signal TOUT1 in FIG. 1), at least one power pad that receives a power supply voltage or power (e.g., the compensated power supply voltage VCP1 or the power supply voltage VPWR1 in FIG. 1), and at least one ground pad that is connected to a ground voltage or ground terminal (e.g., the ground voltage VGND in FIG. 1). For example, a pad may be a contact pad or a contact pin, but example embodiments are not limited thereto.

For example, the plurality of probes 710 may include at least one input probe that is electrically contacted and/or connected to the at least one input pad, at least one output probe that is electrically contacted and/or connected to the at least one output pad, at least one power probe that is electrically contacted and/or connected to the at least one power pad, and at least one ground probe that is electrically contacted and/or connected to the at least one ground pad. The probes 710 may be referred to as probe pins or probe needles.

For example, the at least one input probe may be electrically connected to at least one path transmitting the test input signal (e.g., the test input signal TIN1 in FIG. 1) in the probe card 700, the at least one output probe may be electrically connected to at least one path transmitting the test output signal (e.g., the test output signal TOUT1 in FIG. 1) in the probe card 700, the at least one power probe may be electrically connected to at least one power line (e.g., the power line PL1 in FIG. 1) in the probe card 700, and the at least one ground probe may be electrically connected to at least one ground line (e.g., the ground line GL1 in FIG. 1) in the probe card 700.

Although FIG. 13B illustrates an example where the probe card 700 is connected to one DUT 600, example embodiments are not limited thereto. For example, the number of the probes 710 of the probe card 700 may be greater than the number of the pads 610 of one DUT 600, and the probe card 700 may be connected to a plurality of DUTs. For example, if the number of the pads 610 of one DUT 600 is ten and the number of the probes 710 of the probe card 700 is one hundred, the probe card 700 may be simultaneously connected to ten DUTs and may simultaneously perform the test operation on the ten DUTs.

Referring to FIG. 14, an image sensor 800 includes a pixel array 810 and an image sensor driver integrated circuit. The image sensor driver integrated circuit may include a row driver 820, a correlated double sampling (CDS) block 830, an analog-to-digital converting (ADC) block 840, a digital signal processor (DSP) 850, a ramp signal generator 860 and a timing controller 880. For example, the image sensor 800 may be a complementary metal oxide semiconductor (CMOS) image sensor. For example, the image sensor 800 may be one of the plurality of DUTs formed on the wafer WF.

The pixel array 810 may include a plurality of pixels (or unit pixels) PX that are arranged in a matrix formation. Each of the plurality of pixels PX may be connected to a respective one of a plurality of rows RW1, RW2, . . . , RWX and a respective one of a plurality of columns CL1, CL2, . . . , CLY, where each of X and Y is a positive integer greater than or equal to two. The pixel array 810 may generate a plurality of analog pixel signals VP1, VP2, . . . , VPY based on incident light.

The row driver 820 may be connected to the plurality of rows RW1, RW2, . . . , RWX of the pixel array 810. The row driver 820 may generate driving signals to drive the plurality of rows RW1, RW2, . . . , RWX. For example, the row driver 820 may drive the plurality of pixels PX included in the pixel array 810 row by row.

The CDS block 830 may include a plurality of CDS circuits 830a, 830b, . . . , 830c. The plurality of CDS circuits 830a, 830b, . . . , 830c may be connected to the plurality of columns CL1, CL2, . . . , CLY of the pixel array 810. The plurality of CDS circuits 830a, 830b, . . . , 830c may perform a correlated double sampling (CDS) operation on the plurality of analog pixel signals VP1, VP2, . . . , VPY output from the pixel array 810.

The ADC block 840 may include a plurality of ADC circuits 840a, 840b, . . . , 840c. The plurality of ADC circuits 840a, 840b, . . . , 840c may be connected to the plurality of columns CL1, CL2, . . . , CLY of the pixel array 810 via the plurality of CDS circuits 830a, 830b, . . . , 830c. The plurality of ADC circuits 840a, 840b, . . . , 840c may perform a column analog-to-digital converting (ADC) operation that converts the plurality of analog pixel signals VP1, VP2, . . . , VPY (e.g., a plurality of correlated double sampled analog pixel signals output from the plurality of CDS circuits 830a, 830b, . . . , 830c) into a plurality of digital signals CNT1, CNT2, . . . , CNTY in parallel (e.g., simultaneously or concurrently).

Each of the plurality of ADC circuits 840a, 840b, . . . , 840c may include a respective one of a plurality of comparators 842a, 842b, . . . , 842c and a respective one of a plurality of counters (CNTs) 844a, 844b, . . . , 844c. For example, the first ADC circuit 840a may include the first comparator 842a and the first counter 844a. The first comparator 842a may compare the first analog pixel signal VP1 (e.g., the correlated double sampled first analog pixel signal output from the first CDS circuit 830a) with a ramp signal VRAMP to generate a first comparison signal CS1. The first counter 844a may count a level transition timing of the first comparison signal CS1 to generate the first digital signal CNT1.

Operations of the CDS block 830 and the ADC block 840 may be performed on the plurality of pixels PX included in the pixel array 810 row by row.

The plurality of CDS circuits 830a, 830b, . . . , 830c and the plurality of ADC circuits 840a, 840b, . . . , 840c may form a plurality of column driving circuits. For example, the first CDS circuit 830a and the first ADC circuit 840a may form a first column driving circuit.

The DSP 850 may perform a digital signal processing operation based on the plurality of digital signals CNT1, CNT2, . . . , CNTY. The DSP 850 may output an image signal ISIG that is generated by the digital signal processing operation.

The ramp signal generator 860 may generate the ramp signal VRAMP. The timing controller 880 may control overall operation timings of the image sensor 800, and may generate control signals including a count enable signal CNT_EN, a clock signal (not illustrated), etc.

Figure 15:
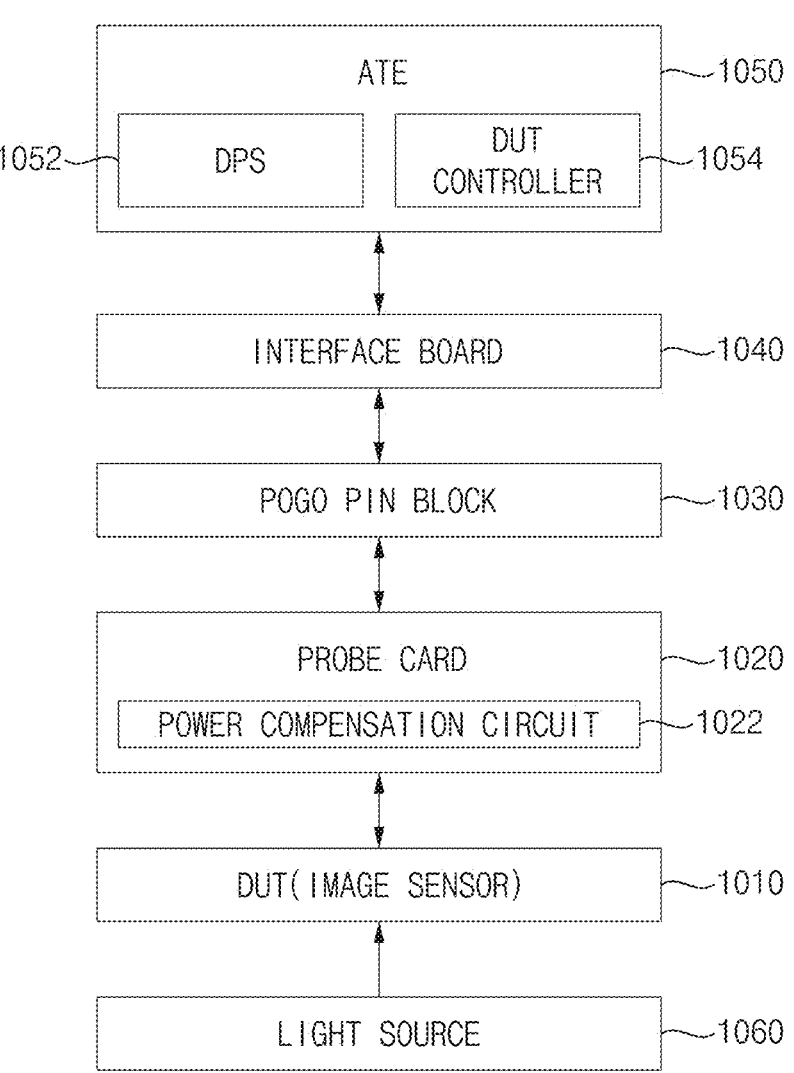
FIG. 15 is a block diagram illustrating a test system according to example embodiments.

FIG. 15 is a block diagram illustrating a test system according to example embodiments. The descriptions repeated with or overlapping with descriptions of FIG. 12 will be omitted in the interest of brevity.

Referring to FIG. 15, a test system 1000 includes a plurality of DUTs 1010, a probe card 1020, a pogo pin block 1030, an interface board 1040, an ATE 1050 and a light source 1060.

The plurality of DUTs 1010, the probe card 1020, a plurality of power compensation circuits 1022 included in the probe card 1020, the ATE 1050, a plurality of power supply circuits 1052 included in the ATE 1050, and a DUT controller 1054 included in the ATE 1050 may be substantially the same as the plurality of DUTs 510, the probe card 520, the plurality of power compensation circuits 522, the ATE 530, the plurality of power supply circuits 532, and the DUT controller 1054 in FIG. 12, respectively.

The plurality of DUTs 1010 may be a plurality of image sensors disposed on a wafer (e.g., the wafer WF in FIG. 13A). As described with reference to FIG. 14, an image sensor may include a pixel array as an image sensing unit, and an image sensor driver integrated circuit as an image processing unit. A final output signal of the image sensor may be generated by the image processing unit. Therefore, to test operating characteristics of the image sensor, an output (e.g., the image signal ISIG in FIG. 14) of the image processing unit may be used.

The light source 1060 may provide test images to the plurality of DUTs 1010. For example, when the plurality of DUTs 1010 are the plurality of image sensors, the light source 1060 may provide test images having various degrees of brightness (e.g., illuminance) to the plurality of image sensors under the control of the ATE 1050. The plurality of image sensors may generate output signals (e.g., the image signal ISIG in FIG. 14) corresponding to the test images.

The probe card 1020 may be provided to perform a test process for testing electrical characteristics of the plurality of DUTs 1010. For example, when the plurality of DUTs 1010 are the plurality of image sensors, the probe card 1020 may apply electrical signals to the image sensors formed on the wafer, and may be provided to perform an electric die sorting (EDS) process for determining whether the image sensors are defective by signals output from the image sensors in response to the applied electrical signals. In addition, the probe card 1020 may be applied to an arbitrary test process for testing whether the plurality of DUTs 1010 (e.g., plurality of image sensors) are defective.

For example, the probe card 1020 may apply at least one of an electrical signal provided from the ATE 1050, for example, at least one of power and a signal, to the wafer including the image sensors (e.g., the DUTs 1010), and may provide a signal output in response to the applied electrical signal to the ATE 1050 (e.g., as an output signal of the probe card 1020). During the test process, probe pins of the probe card 1020 may physically contact a pad on the wafer (e.g., the image sensors or the DUTs 1010) to transmit an electrical signal to the wafer, or receive a signal output from the wafer.

The pogo pin block 1030 may include a plurality of pins for connecting the probe card 1020 with the interface board 1040. For example, each of the plurality of pins may include a POGO pin. The pogo pin block 1030 may receive output signals of the probe card 1020.

The interface board 1040 may be implemented to map the probe card 1020 and the ATE 1050.

In some example embodiments, the interface board 1040 may be implemented corresponding to a communication standard of the plurality of DUTs 1010. For example, when the plurality of DUTs 1010 are the plurality of image sensors and operate based on Mobile Industry Processor Interface (MIPI) standard, the interface board 1040 may be implemented in one of MIPI C-PHY, MIPI D-PHY, MIPI M-PHY and MIPI A-PHY. MIPI is a serial interface connecting hardware and software between the processor and peripheral devices according to a serial interface communication standard. Accordingly, it will be understood that the interface board 1040 may be configured to correspond to (e.g., conform to) one or more serial interface communication standards of the image sensor (e.g., the DUTs 1010). However, example embodiments are not limited to the above-described MIPI standards, and the interface board 1040 may perform communication according to any type of communication interface corresponding to a serial interface standard output from a CMOS image sensor.

In some example embodiments, the interface board 1040 may receive data from the plurality of image sensors according to the MIPI C-PHY communication standard. C-PHY may have only up to up to a maximum of three data lanes, and unlike D-PHY, three transmission lines may be used per lane. A clock may have no separate lane and may be embedded in the data being transmitted. Therefore, a module (e.g., a clock data recovery (CDR)) finding the embedded clock on a data receiving side may be used. In C-PHY, one lane may consist of three lines, and each line may transmit high, middle and low signals. Accordingly, a total of twenty-seven types of signals may be transmitted through one lane. Thereamong, six cases that can utilize the characteristics of a differential signal may be selected and used.

In some example embodiments, the interface board 1040 may receive data from the plurality of image sensors according to the MIPI D-PHY communication standard. D-PHY may perform a basic role that a general physical layer (PHY) plays. An operation of adding start of packet (SoT)/end of packet (EoT) indicating a start and an end of actual data and converting parallel data to serial data for transmission or converting received serial data to parallel data may be performed. In addition, a clock system to transmit a clock signal for high-speed image data transmission may be managed. D-PHY may operate in either a high-speed mode or a low-power mode. The high-speed mode may be used to transmit high-speed image data, and transmitted through two transmission lines as a differential signal of about 80 Mb/s to 1 Gb/s transmission rate with a common mode voltage of about 0.2V and a swing of about 0.2V in a scalable low voltage signaling (SLVS) scheme. In the high-speed mode, a clock signal may be sent through a separate clock lane. The D-PHY may consist of one clock lane and one or up to a maximum of four data lanes.

In some example embodiments, the interface board 1040 may receive data from the plurality of image sensors according to the MIPI M-PHY communication standard. In M-PHY, a clock may take an embedded method in which data is included and transmitted. Therefore, a clock data recovery (CDR) to read the clock from data may be desired at a receiving end. In M-PHY, an 8b/10b encoding scheme may be used. In a high-speed mode of M-PHY, it may transmit up to the maximum of about 5.8 Gb/s per lane. In a low-power mode, transmission may be performed at about 10 k to 600 Mb/s. In M-PHY, simultaneous bidirectional transmission/reception may be possible (full duplex mode), transmission lanes may be gathered to form a transmission sub-link, and reception lanes may be gathered to form a reception sub-link. Each of the sub-links may have up to a total of four lanes.

In some example embodiments, the interface board 1040 may receive data from the plurality of image sensors according to the MIPI A-PHY communication standard. To use a MIPI technology in automobiles, components acting as a bridge in the middle may be used. This is referred to as a serializer & deserializer (SERDES) solution. Since MIPI DSI or CSI signals cannot travel long distances, the DSI or CSI signals may be converted into serial signals that can travel long distances through a serializer component. After the serial signals are moved, the serial signals may be restored to original signals through a deserializer. A-PHY specification may be a SERDES solution that can transmit signals up to about fifteen meters. For example, signals transmitted through the MIPI A-PHY may be DP/eDP, MIPI DSI, and MIPI CSI. These transmitted signals may be converted into signals suitable for A-PHY through a Protocol Adaptation Layer (PAL).

However, example embodiments are not limited thereto, and the plurality of DUTs 1010 may be at least one of various semiconductor integrated circuits. For example, the plurality of DUTs 1010 may be memory devices that store data, and the test input signal and the test output signal may be write data and corresponding read data.

Figure 16:
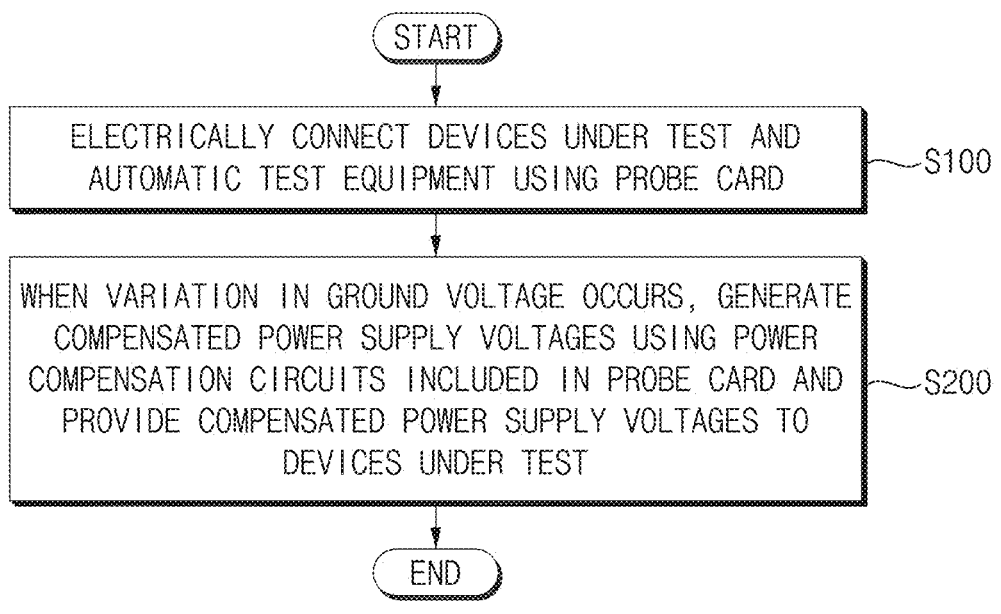
FIG. 16 is a flowchart illustrating a test method according to example embodiments.

FIG. 16 is a flowchart illustrating a test method according to example embodiments.

Referring to FIG. 16, in a test method according to example embodiments, a plurality of DUTs and an ATE are electrically connected using or through a probe card (operation S100). For example, the probe card may be the probe card according to example embodiments described with reference to FIGS. 1 through 11, and may include a plurality of power lines, a plurality of ground lines and a plurality of power compensation circuits.

When a variation in a ground voltage of the plurality of ground lines occurs while the probe card is operating (e.g., during the test operation), a plurality of compensated power supply voltages for cancelling out or inhibiting the variation in the ground voltage are generated using the plurality of power compensation circuits, and are provided to the plurality of power lines and the plurality of DUTs (operation S200). The plurality of power compensation circuits may detect and compensate for voltage variations of the plurality of ground lines in real-time. Accordingly, the power supplied to the plurality of DUTs may be maintained at a constant level, and the yield degradation may be prevented or inhibited even when the plurality of DUTs are tested simultaneously.

In some example embodiments, semiconductor integrated circuits and/or semiconductor devices may be manufactured, and the manufactured semiconductor integrated circuits and/ or semiconductor devices may be tested using the test method of FIG. 16.

The example embodiments may be applied in a manufacturing process of various types of semiconductor integrated circuits and/or semiconductor devices, and more particularly, in an inspection of a mass production process to detect whether the semiconductor integrated circuits and/or the semiconductor devices have defects or not.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A probe card for testing a plurality of devices under test (DUTs), the probe card comprising:
   a plurality of power lines that are electrically connected to the plurality of DUTs;
   a plurality of ground lines that are electrically connected to the plurality of DUTs and to each other; and
   a plurality of power compensation circuits that are electrically connected to respective ones of the plurality of power lines and respective ones of the plurality of ground lines,
   wherein the plurality of power compensation circuits are configured to generate and provide a plurality of compensated power supply voltages to the respective ones of the plurality of power lines, and
   wherein the plurality of compensated power supply voltages are configured to inhibit a variation of a ground voltage of the respective ones of the plurality of ground lines.

2. The probe card of claim 1, wherein a first power compensation circuit among the plurality of power compensation circuits comprises:
   a first subtractor that is electrically connected to a first power line among the plurality of power lines and a first ground line among the plurality of ground lines, wherein the first subtractor is configured to obtain a first sensing signal that is based on a first voltage difference between a voltage of the first power line and a voltage of the first ground line; and
   a first linear regulator that is configured to generate a first compensated power supply voltage among the plurality of compensated power supply voltages based on a first power supply voltage and the first sensing signal, wherein the first voltage difference is fixed, and wherein the first linear regulator is configured to provide the first compensated power supply voltage to the first power line.

3. The probe card of claim 2, wherein:
   the first power line and the first ground line are electrically connected to a first DUT among the plurality of DUTs,
   when the first DUT receives a current, the voltage of the first ground line increases by a first voltage, and
   the first power compensation circuit is configured to generate the first compensated power supply voltage such that the voltage of the first power line increases by the first voltage.

4. The probe card of claim 3, wherein:
   the plurality of power compensation circuits comprise a second power compensation circuit that is electrically connected to a second power line among the plurality of power lines and a second ground line among the plurality of ground lines,
   when the first DUT receives the current, a voltage of the second ground line increases by a second voltage, and
   the second power compensation circuit is configured to generate a second compensated power supply voltage among the plurality of compensated power supply voltages such that the voltage of the second power line increases by the second voltage.

5. The probe card of claim 4, wherein the second voltage is less than the first voltage.

6. The probe card of claim 5, wherein the second voltage decreases as a distance between the first ground line and the second ground line increases.

7. The probe card of claim 2, further comprising a plurality of switches that are configured to control electrical connections between the plurality of power lines and the plurality of power compensation circuits.

8. The probe card of claim 7, wherein the plurality of switches comprise:
   a first switch between the first power line and an input terminal of the first subtractor;
   a second switch between the first power line and an input terminal of the first linear regulator;
   a third switch between the first power line and an output terminal of the first linear regulator; and
   a fourth switch that is on the first power line and is between the second switch and the third switch.

9. The probe card of claim 8, wherein, when the first switch, the second switch and the third switch are closed and the fourth switch is open, the first compensated power supply voltage is provided to a first DUT among the plurality of DUTs.

10. The probe card of claim 8, wherein, when the first switch, the second switch and the third switch are opened and the fourth switch is closed, the first power supply voltage is provided to a first DUT among the plurality of DUTs.

11. The probe card of claim 2, wherein the first power compensation circuit further comprises a level setting circuit that is configured to set an output voltage of the first linear regulator.

12. The probe card of claim 1, further comprising a plurality of feedback lines that are electrically connected to the respective ones of the plurality of power lines.

13. The probe card of claim 12, further comprising a plurality of switches that are configured to control electrical connections between the plurality of power lines and the plurality of feedback lines.

14. The probe card of claim 1, further comprising a plurality of probes that are configured to electrically connect the plurality of power lines to respective ones of the plurality of DUTs and wherein the plurality of probes are configured to electrically connect the plurality of ground lines to the respective ones of the plurality of DUTs.

15. A test system comprising:

a probe card that is configured to electrically connect to a plurality of devices under test (DUTs); and an automatic test equipment (ATE) that is electrically connected to the plurality of DUTs through the probe card, wherein the ATE is configured to test the plurality of DUTs, wherein the probe card comprises:

a plurality of power lines that are electrically connected to the plurality of DUTs;

a plurality of ground lines that are electrically connected to the plurality of DUTs and to each other; and a plurality of power compensation circuits that are electrically connected to respective ones of the plurality of power lines and respective ones of the plurality of ground lines, wherein the plurality of power compensation circuits are configured to generate and provide a plurality of compensated power supply voltages to the respective ones of the plurality of power lines, and wherein the plurality of compensated power supply voltages are configured to inhibit a variation of a ground voltage of respective ones of the plurality of ground lines.

16. The test system of claim 15, wherein:

the plurality of power lines comprise a first power line and a second power line, the plurality of ground lines comprise a first ground line and a second ground line, the plurality of power compensation circuits comprise a first power compensation circuit and a second power compensation circuit, and the plurality of DUTs comprise a first DUT and a second DUT, the first power line, the first ground line, and the first power compensation circuit are electrically connected to the first DUT, and the second power line, the second ground line, and the second power compensation circuit are electrically connected to the second DUT.

17. The test system of claim 15, wherein:

the plurality of power lines comprise a first power line and a second power line, the plurality of ground lines comprise a first ground line and a second ground line, the plurality of power compensation circuits comprise a first power compensation circuit and a second power compensation circuit, and the plurality of DUTs comprise a first DUT, wherein the first power line and the second power line, the first ground line and the second ground line, and the first power compensation circuit and the second power compensation circuit are electrically connected to the first DUT.

18. The test system of claim 15, wherein the plurality of DUTs comprise a plurality of image sensors on a wafer.

19. The test system of claim 18, further comprising a light source that is configured to provide test images to the plurality of image sensors.

20. A probe card for testing a plurality of devices under test (DUTs), the probe card comprising:

a plurality of probes;

a plurality of power lines that are electrically connected to respective ones of the plurality of DUTs by respective ones of the plurality of probes;

a plurality of ground lines that are electrically connected to each other and the respective ones of the plurality of DUTs by the respective ones of the plurality of probes; and a plurality of power compensation circuits that are electrically connected to respective ones of the plurality of power lines and respective ones of the plurality of ground lines, wherein the plurality of power compensation circuits configured to generate and provide a plurality of compensated power supply voltages to the respective ones of the plurality of power lines, wherein the plurality of compensated power supply voltages are configured to inhibit a variation of a ground voltage of the respective ones of the plurality of ground lines, and wherein each of the plurality of power compensation circuits comprises:

a subtractor that is electrically connected to a respective one of the plurality of power lines and a respective one of the plurality of ground lines, wherein the subtractor is configured to obtain a sensing signal that is based on a voltage difference between a voltage of the respective one of the plurality of power lines and a voltage of the respective one of the plurality of ground lines;

a linear regulator that is configured to generate a respective one of the plurality of compensated power supply voltages based on the sensing signal such that the voltage difference is fixed, wherein the linear regulator is configured to provide the respective one of the plurality of compensated power supply voltages to the respective one of the plurality of power lines; and a level setting circuit that is configured to determine an output voltage of the linear regulator.

* * * * *